(12) United States Patent
Musha et al.

(10) Patent No.: US 8,382,421 B2
(45) Date of Patent: Feb. 26, 2013

(54) TRANSPORT APPARATUS

(75) Inventors: Kazuhiro Musha, Chigasaki (JP);
Hirofumi Minami, Chigasaki (JP);
Kenji Ago, Chigasaki (JP); Takashi Asaishi, Chigasaki (JP); Toshio Koike, Chigasaki (JP)

(73) Assignee: Ulvac, Inc., Chigasaki-shi (JP)

( * ) Notice: Subject to any disclaimer, the term of this patent is extended or adjusted under 35 U.S.C. 154(b) by 510 days.

(21) Appl. No.: 12/564,572

(22) Filed: Sep. 22, 2009

(65) Prior Publication Data
US 2010/0040447 A1    Feb. 18, 2010

Related U.S. Application Data

(63) Continuation of application No. PCT/JP2008/054352, filed on Mar. 11, 2008.

(30) Foreign Application Priority Data

Apr. 5, 2007 (JP) .................. 2007-099476
Apr. 17, 2007 (JP) .................. 2007-107845

(51) Int. Cl.
*B25J 18/00* (2006.01)
(52) U.S. Cl. ............... 414/744.5; 901/15; 74/490.01
(58) Field of Classification Search ............ 414/744.5; 901/15, 21, 28; 74/490.01, 490.04, 490.05
See application file for complete search history.

(56) References Cited

U.S. PATENT DOCUMENTS

| 5,147,175 | A | * | 9/1992 | Tada | 414/744.5 |
| 5,725,352 | A | * | 3/1998 | Tanaka | 414/744.5 |
| 6,575,691 | B1 | * | 6/2003 | Saeki | 414/744.5 |
| 2005/0036877 | A1 | | 2/2005 | Ogawa | |

FOREIGN PATENT DOCUMENTS

| JP | 9-283588 | 10/1997 |
| JP | 10-296666 | 11/1998 |
| JP | 11-216691 | 8/1999 |
| JP | 2000-1218 | 1/2000 |
| JP | 2000-42952 | 2/2000 |
| JP | 2002-134584 A1 | 5/2002 |
| JP | 2004-98284 A1 | 4/2004 |
| JP | 2005-125479 A1 | 5/2005 |
| JP | 2005-144605 A1 | 6/2005 |

OTHER PUBLICATIONS

International Search Report for International Application No. PCT/JP2008/054352 dated Apr. 7, 2008.

* cited by examiner

*Primary Examiner* — Donald Underwood
(74) *Attorney, Agent, or Firm* — Kratz, Quintos & Hanson, LLP

(57) ABSTRACT

A compact transport apparatus that does not cause pollution to its environment is provided. In a transport apparatus according to a first aspect of the present invention, an installation area of the apparatus is small because first and second rotary shafts are arranged concentrically, and a dead center escaping mechanism has a simple structure with a small thickness. Since a connecting portion of a hand portion can be made thin, an opening of a gate valve through which the hand portion is inserted can be reduced. As a result, it becomes difficult for dust inside a transport chamber to enter a processing chamber. A second aspect of the present invention is directed to a spaced dual shaft-type transport apparatus. Although the lengths of first arms provided at rotating shafts may differ from the lengths of second arms provided between the first arms and a substrate supporting portion, the apparatus is free from malfunction even when the lengths thereof differ because the transmission of a rotative force of a dead center escaping mechanism is released at a position except at a dead center in the present invention.

10 Claims, 13 Drawing Sheets

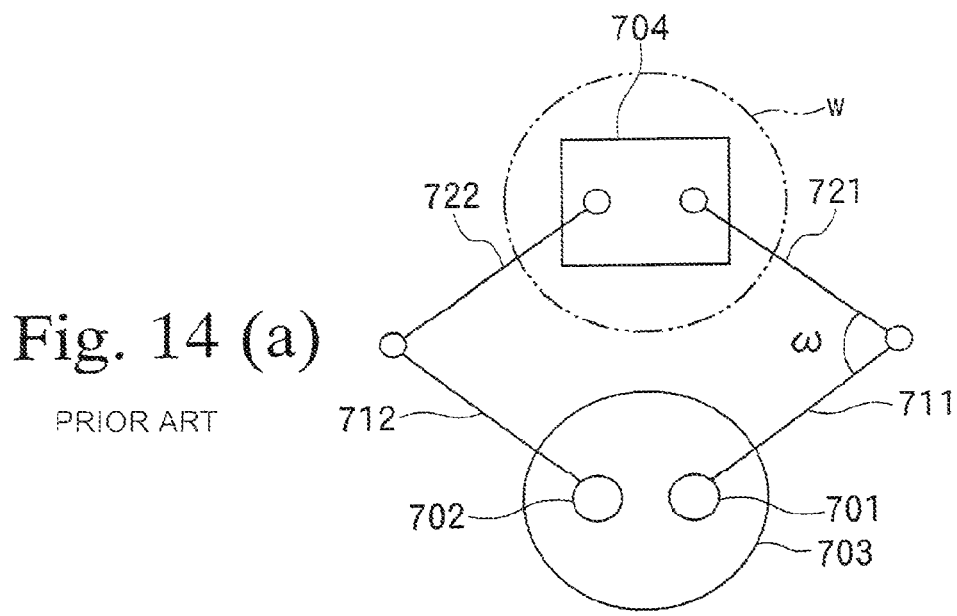
Fig. 14 (a) PRIOR ART
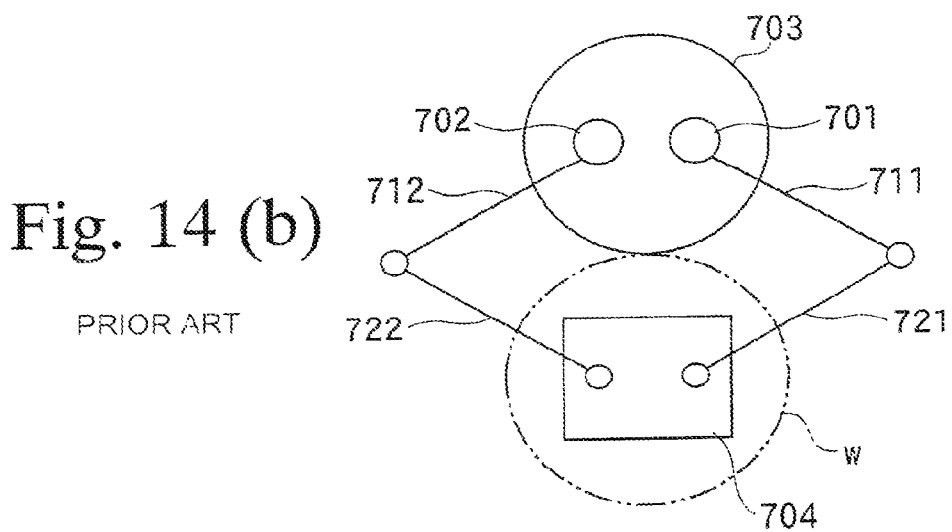
Fig. 14 (b) PRIOR ART
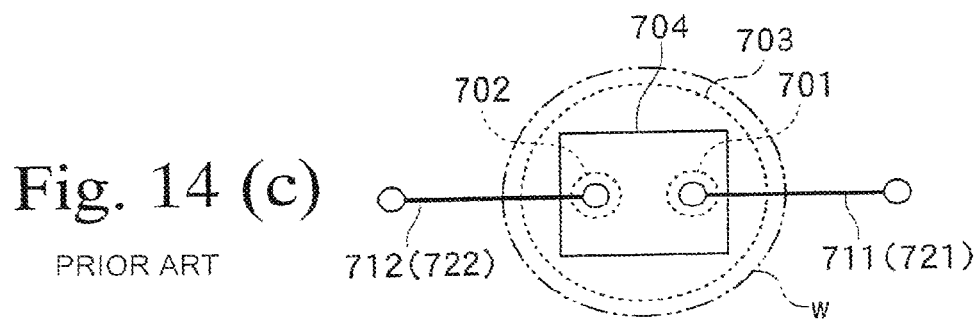
Fig. 14 (c) PRIOR ART

TRANSPORT APPARATUS

The present invention is a Continuation of International Application No. PCT/JP2008/054352 filed Mar. 11, 2008, which claims priority to Japan Patent Documents No. 2007-099476, filed on Apr. 5, 2007 and No. 2007-107845, filed on Apr. 17, 2007. The entire disclosures of the prior applications are hereby incorporated by reference herein in their entireties.

TECHNICAL FIELD

The present invention generally relates to a technical field of the transport apparatuses. More particularly, a first aspect of the present invention relates to a transport apparatus having a dead center escaping mechanism, and a second aspect thereof relates to a transport apparatus for transporting, for example, a semiconductor substrate or the like to a desired position when it is carried into or out of a vacuum processing chamber.

BACKGROUND ART

Background Art of the First Aspect

When a transport apparatus is used for transporting silicon wafers, glass substrates or the like, the area in which it operates is often limited by the environment in which it is used. For example, when the transport apparatus is operated in a semiconductor producing apparatus or the like under a special environment (such as, in a vacuum), the former must be operated within a limited space inside the latter, so that the transport apparatus is required to have a small turning radius.

Meanwhile, when an object to be transported is to be transported into a processing chamber or the like isolated by a valve, in order to diminish the influence which is imposed upon an environment of the processing chamber as much as possible, the transport apparatus itself is required not only to be sufficiently clean as not to pollute the environment in which it is used, but also to make the portion where the transport apparatus enters the valve and the processing chamber as small as possible. To satisfy these requirements is very important because it leads to a reduction in size of the apparatus or the area of the valve, and also closely relates to reduction in cost and saving in space.

Descriptions of transport apparatuses for transporting wafers, glass substrates or the like are found in, for example JP-A 2002-134584 and JP-A H11-216691.

FIG. 7 shows a schematic view of JP-A 2002-134584, and FIG. 8 shows a schematic view of JP-A H11-216691.

According to the transport apparatus 500 described in JP-A 2002-134584, a first link 501 fixedly fitted to a first driving shaft (not shown here), a second link 502 fixedly fitted to a second driving shaft (not shown here), a third link 503 connected to the other end of the first link 501, a fourth link 504 connected to the other end of the second link 502, and a substrate holding portion 510 fitted rotatably to the third link 503 and the fourth link 504.

The link lengths of the first link 501, the second link 502, the third link 503 and the fourth link 504 are all equal; the first driving shaft and the second driving shaft are arranged concentrically; and a connecting portion of the third link 503 and the substrate holding portion 510 and a connecting portion of the fourth link 504 and the substrate holding portion 510 are arranged concentrically.

In this transport apparatus 500, when the first driving shaft and the second driving shaft rotate synchronously in opposite phases, the substrate holding portion moves along a vertical line (hereinafter, a transport line) which is drawn down from the first and second driving shafts to a straight line connecting a connecting portion of the first link 501 and the third link 503 and a connecting portion between the second link 502 and the forth link 504.

As a mechanism for passing a position in which the first link 501 and the second link 502 form an open angle of 180 degrees, a power transmission mechanism is provided for transmitting a rotative power of the first link 501 to the fourth link 504. The power transmission mechanism comprises a first gear 511 fixed to a driving shaft of the first link 501, a fourth gear 514 fixed to one end portion of the fourth link 504, a second gear 512 and a third gear 513 meshing with the first gear 511 and the fourth gear 514, and a link 515.

A transport apparatus 600 described in JP-A H11-216691 is constructed by a first upper arm 601 fixedly fitted to a first driving shaft (not shown), a second upper arm 602 fixedly fitted to a second driving shaft, a first forearm 611 connected to the other end of the first upper arm 601, a second forearm 612 connected to the other end of the second upper arm 602, first wrist 621 and second wrist 622 fitted rotatably to the first forearm 611 and the second forearm 612, and a substrate holding portion 610 including an error correction mechanism.

The link length of the first upper arm 601 and the second upper arm 602 differs from that of the first forearm 611 and the second forearm 612, a first driving shaft and a second driving shaft are concentrically arranged; the other end portion of the first forearm 611 is connected freely rotatably to the first wrist 621; and the other end portion of the second forearm 612 is freely rotatably connected to the second wrist 622. A belt 615 is used as a power transmission mechanism for transmitting a rotative force of the driving shaft to the first and second forearms 611, 612.

In this transport apparatus 600, the link length of the first upper arm 601 and the second upper arm 602 is different from that of the first forearm 611 and the second forearm 612; and in order to move along the transport line, the transport apparatus comprises a spring 635 connected to the first wrist 621 and the second wrist 622, linear rails 631 provided at the second wrist 622, and linear guides 632 provided at the substrate holding portion 610.

The transport apparatuses 500, 600 described in JP-A 2002-134584 and JP-A H11-216691 have the advantages of the first driving shaft and the second driving shaft being arranged concentrically, and the turning radius being made smaller.

However, according to the transport apparatus 500 described in JP-A 2002-134584, since the other end of the third link 503 connected to the first link 501 and the other end of the fourth link 504 connected to the second link 502 are concentrically arranged, the transport apparatus has a structure in which the thickness of a connecting portion between the second link 502 and the fourth link 504 is very large. More particularly, when the transport apparatus is installed in a semiconductor-producing apparatus or the like, it has a disadvantage in that a gate valve or the like has to be made larger.

According to the transport apparatus 600 described in the above JP-A H11-216691, since the connecting portion between the first forearm 611 and the first wrist 621 and the connecting portion between the second forearm 612 and the second wrist 622 are spaced apart from each other, the connection portions between the forearms and the wrists are of thin structures. However, an error correction mechanism composed of the spring 635 and the linear guides 632 is installed, which complicates the structure and raises the cost due to the increased number of component parts. In addition, factors that pollute the environment of the apparatus (such as, dust from the linear guides 632, a released gas of grease coated onto the linear guides 632 or the like) increase.

Prior Art of the Second Aspect

Recently, super miniaturization and high accuracy have been required for the semiconductor elements, and apparatuses for producing such semiconductor elements are required to improve the throughput and decrease a floor area in which the apparatus is to be installed.

For this purpose, in a multi-chamber apparatus wherein a plurality of processing chambers are arranged circumferentially around a transport chamber and are connected via gate valves so that substrates can be consistently processed in vacuum in various ways, a transport apparatus is used to automatically carry the substrates from the transport chamber into and out of each of the processing chambers.

An arm type and a frog leg type have been known for the transport apparatuses, and the frog leg type transport apparatus is constructed as diagrammatically shown in FIGS. 14(*a*) to (*c*), for example. The frog leg type transport apparatus comprises a base 703 provided with a pair of rotating shafts 701, 702 rotating in mutually different directions, a pair of first arms 711, 712 having respective one ends connected to the rotating shafts 701, 702, a pair of second arms 721, 722 having one ends rotatably connected to the respective other ends of these first arms 711, 712, and a substrate supporting portion 704 connected to the respective other ends of these second arms 721, 722.

Each of the first arms 711, 712 and the second arms 721, 722 has the same arm length, and a parallel linkage mechanism is constituted by the first and second arms. Therefore, by rotating the rotating shafts 701, 702, respectively, in mutually opposite directions, an angle w formed by the first arm 711, 712 and the second arm 721, 722 varies, so that the substrate supporting portion 704 moves vertically in the figure. Hereby, a substrate w on the substrate supporting portion 704 can be transported to an arbitrary position. Further, the substrate supporting portion 704 is rotatably moved around the base 103 by turning the base 103 around its axis. In addition, a driving motor (driving source) is connected either one of the rotating shafts 101, 102.

In the frog leg type transport apparatus having such a construction, when the substrate w is to be transported from a front position shown in FIG. 14(*a*) to a rear position shown in FIG. 14(*b*) as viewed from the base 703, the substrate needs to pass a position, as shown in FIG. 14(*c*), in which a pair of the first arms 711, 712 and a pair of the second arms 721, 722 are in parallel to each other (ω=0 degree). The arm position shown in this FIG. 14(*c*) corresponds to the dead center of the parallel linkage mechanism. Thus, in the prior art transport apparatus, a dead center escaping mechanism is provided to give a driving force to the second arms 721, 722 in a moving direction in order to smoothly transport the substrate w.

FIG. 15 shows the construction of a conventional transport apparatus 705 equipped with a dead center escaping mechanism as described above (see the below-mentioned Patent Document 1). In FIG. 15, the same reference numerals are given to parts corresponding to FIGS. 14(*a*) to (*c*). In this embodiment, the rotating shafts 701, 702 are arranged mutually coaxially, and have independent driving sources, respectively. The substrate supporting portion 704 is configured so as to be able to simultaneously support two substrates w.

The illustrated conventional transport apparatus 705 comprises a first pulley 706 concentrically fixed to the rotating shaft 702, a second pulley 707 fixed concentrically to a connecting portion between the first arm 711 and the second arm 721, and a belt 708 stretched over between these first and second pulleys 706 and 707. Owing to this construction, a rotative force of the rotating shaft 702 is transmitted directly to the second arm 721 via the belt 708, so that the linkage can smoothly pass the dead center position of the links.

However, since the transport apparatus 705 equipped with the conventional dead center escaping mechanism shown in FIG. 15 is configured to always give a rotative force to the second arm 721 from the rotating shaft 702, there is a problem that a rotation angle of the second arm 721 is always restrained by the rotating shaft 702, whereby this causes the accuracy in transporting the substrate to be damaged.

In other words, since the second arm 721 rotates interlocking with the rotation motion of the first arm 711, a rotation amount of the rotating shaft 102 as well as the rotation angle of the first arm 711 is transmitted directly during the transport process of the substrate w.

It is configured that when a posture controlling unit is attached in the state that an angle formed by the second arm 721 of the right arm and an angle formed by the second arm 722 of the left arm with respect to a line segment between the connecting positions between a pair of the second arms and the substrate 2 supporting portion 104 connected to the second arms are made equal, the posture control unit maintains its state. As a result, even if the substrate supporting portion 104 moves, the posture of the substrate supporting portion 104 is kept constant relative to a pair of the rotating shafts 701, 702.

If the length of the first arms 711, 712 differs from that of the second arms 721, 722, when a pair of the rotating shafts 101, 102 relatively rotate, the angle $\omega_1$ formed by the first arms 711, 712 differs in magnitude from the angle of $\omega_2$ formed by the second arms 721, 722 relative to a line segment connecting both rotation centers $q_1$, $q_2$ of a pair of the second arms 721, 722 relative to the first arms 711, 712, excluding the dead center position.

In this case, when the first arm 112 and the second arm 721 (or the first arm 111 and the second arm 722) are connected by the dead center escaping mechanism even the place outside the dead center, and the rotation angles mutually interact, the first and second arms 711, 712, 721, 722 cannot rotate at an angle contrary to the control of the posture control unit.

In the case that the driving shafts are concentric and the wrist portions are spaced therefrom as shown in FIG. 15, the substrate supporting portion cannot pass the dead center even if the length of the first arms is equal to that of the second arms. By configuring the second pulley 107 so as to make $\omega_1$ and $\omega_2$ equal in magnitude as shown in JP-A H9-283588, movement of the transport apparatus is possible anywhere without being contrary to the control of the posture control unit. However, the second arm 721 is too constraint, which may cause vibration during transporting the substrates or damage the linear movement of the substrates.

Patent Documents 1 and 2 are recited as the prior art in the first aspect, and Patent Document 3 is recited as the prior art in the second aspect. See Patent Document 1: JP2002-134584, Patent Document 2: JP-A H11-216691, and Patent Document 3: JP-A H9-283588.

DISCLOSURE OF THE INVENTION

Problems to be Solved by the Invention

The first aspect of the present invention is aimed at providing a compact transport apparatus causing no pollution to an apparatus environment and having a dead center escaping mechanism. In order to solve the above-described problems, the second aspect of the present invention is aimed at providing a transport apparatus which can prevent excessive restraint of second arms, while smoothly performing the passage of a dead center.

Measures to Solve the Problems

In order to solve the above problems, the invention of the first aspect of the present invention is directed to a transport apparatus, which includes first and second rotary shafts configured so as to be rotatable around the same driving rotary axis, first and second drive links having base portions fixed to the first and second rotary shafts and being rotated by the first and second rotary shafts, respectively, first and second main rotary axes arranged at tip portions of the first and second drive links, first and second driven links having base portions fitted rotatably to the first and second drive links around the first and second main rotary axes, first and second auxiliary rotary axes arranged at tip portions of the first and second driven links, the first and second auxiliary rotary axis being spaced each other, a hand portion fitted rotatably to tip portions of the first and second driven links around the first and second auxiliary rotary axes, and a posture control unit for making angles of the first and second driven links equal with respect to a line segment connecting the first and second auxiliary rotary axes and constituting an interaxial distance. The hand portion is configured so as to move with its identical portion being directed toward a side of the first and second shafts by the posture control unit; the distance from the first main rotary axis to the second main rotary axis through the driving rotary axis is equal to the distance from the first main rotary axis to the second main rotary axis through the first auxiliary rotary axis and the second auxiliary rotary axis in this order; the driving rotary axis, the first and second main rotary axes and the first and second auxiliary rotary axes are arranged in parallel. The transport apparatus includes a dead center escaping mechanism for moving the hand portion, in a state in which the hand portion is positioned at a dead center where both an angle between the first and second drive links and an angle between the first and second driven links are 180 degrees, from a position of the dead center to a predetermined direction. The dead center escaping mechanism comprises a first engaging member to be rotated by the first rotary shaft or the second rotary shaft, a second engaging member which engages with the first engaging member when the hand portion is located at the dead center and is rotated by a rotative force of the first engaging member, and a transmission mechanism for transmitting a rotative force of the second engaging member to the second driven link and rotating the second driven link in a direction identical with a rotating direction of the first drive link. The first and second engaging portions engage in a range of −16 degrees or more to +16 degrees or less from the dead center position, and the transmission of the rotative force of the first engaging member to the second driven link is released by releasing the engagement between the first and second engaging members.

Further, the first aspect of the present invention is directed to the transport apparatus, wherein one of the first and second engaging members comprises a projection, the other comprises a depression, and the projection is fitted into the depression when the hand portion is located at the dead center.

Furthermore, the first aspect of the present invention is directed to the transport apparatus, wherein the posture control unit comprises first and second rotary members which rotate around the first and second auxiliary rotary axes, and the first and second rotary members are configured so as to rotate by the same angle in mutually opposite directions.

In addition, the first aspect of the present invention is directed to the transport apparatus, wherein the first and second rotary members are gears fixed to the first and second driven links, respectively, and the gears thereof are meshed with each other.

Moreover, the first aspect of the present invention is directed to the transport apparatus, wherein the first and second rotary members are pulleys fixed to the first and second driven links, respectively, the first and second rotary members are spaced apart from each other, and cross wound with a belt or a chain in an 8-letter form.

The invention of the second aspect of the present invention is directed to a transport apparatus comprising a pair of rotating shafts which is spaced apart from each other, at least one of them being connected to a driving source, a pair of first arms having one ends connected to a pair of these rotary shafts, a pair of second arms having one ends connected rotatably to the other ends of a pair of the first arms, respectively, and a substrate supporting portion connected rotatably to the other ends of a pair of the second arms, respectively, wherein interaxial distances of a pair of the first arms are equal to each other, interaxial distances of a pair of the second arms are equal to each other, the interaxial distance of the first arm is different in magnitude from that of the second arm, a distance between connecting positions at which the substrate supporting portion and a pair of the second arms are connected is set constant. The transport apparatus comprises a posture control unit for keeping angles of a pair of the second arms with respect to a line segment connecting the connecting positions equal, and a dead center escaping mechanism which affords a rotative force to the second arm only when passing a dead center position where the first arms and the second arms are in parallel to each other. The dead center escaping mechanism comprises a rotation driving portion communicating with the rotating shaft, and an engaging portion which is provided on the second arm or the substrate supporting portion and engages with the rotation driving portion when the substrate support portion passes the dead center position. The rotation driving portion comprises a fixed gear disposed concentrically with the rotating shaft, a first rotary gear axially supported in the vicinity of one end of the first arm and meshing with the fixed gear, a second rotary gear axially supported in the vicinity of the other end of the first arm, and a rotative force transmission member for transmitting a rotative force of the first rotary gear to the second rotary gear. The engaging portion is fixed to a connecting shaft between the first arm and the second arm; and the engaging portion has an engaging tooth engageable with the second rotary gear at a part of an outer circumferential portion thereof.

Further, the second aspect of the present invention is directed to the transport apparatus, wherein the rotation driving portion comprises a driving shaft conversion portion for converting a rotary axis of the rotating shaft to a direction perpendicular thereto, and a rotary gear to rotate around the converted rotary axis, and the engaging portion is a flat gear which is provided on a downward faced side of the substrate supporting portion and is engageable with the rotary gear.

Moreover, the first aspect of the present invention is directed to the transport apparatus, wherein the first and second engaging members are gear wheels having two or more teeth.

Furthermore, the second aspect of the present invention is directed to the transport apparatus, wherein the engaging teeth are formed so as to engage with each other in a range of −16 degrees or more to +16 degrees or less around the dead center position.

In addition, the first aspect of the present invention is directed to the transport apparatus, wherein the first and second engaging members are gear wheels having two or more teeth, and the gear wheels mesh with each other when the hand portion is located at the dead center.

The present invention is constructed as described above, and in the invention of the first aspect, the dead center escaping mechanism enables the substrate supporting portion or the hand portion to smoothly pass the dead center position in which the open angle between the first and second drive links is 180 degrees.

In the dead center escaping mechanism of the first aspect of the present invention, the first and second engaging members engage to transmit the rotative force only when the open angle between the first and second drive links is in a range of 180 degrees $-\theta_0 \leq \theta \leq 180$ degrees $+\theta_0$. When it is outside the above range, the engagement is released so that the second driven link becomes independent of the rotation motion of the first driven link.

The angle in which the first and second engaging members are kept engaged is $2 \times \theta_0$. The first and second engaging members are preferably formed such that $\theta_0$ ideally becomes 0 degree.

The first and second auxiliary rotary axes are spaced by a constant distance D, and the interaxial distance of the first and second drive links and the interaxial distance of the first and second driven links differ in length by a half (D/2) of the interaxial distance between the first and second auxiliary rotary axes. Therefore, the rotation angle $\theta_1$ between the first and second drive links around the driving rotary axis and the rotation angle $\theta_2$ between the first and second driven links around the first and second main rotary axes at the time when the first and second rotary shafts rotate are equal only when the hand portion is located at the dead center; that is, $\theta_1 = \theta_2 = 0$ degree, and the rotation angles $\theta_1$, $\theta_2$, are different in magnitude when the hand portion locates at other than the dead center.

If the first or second drive links and the first or second driven link, respectively, are provided with gears which rotate by the same magnitude as the rotation angle of each of the links and between the gears are connected by a linkage mechanism or an auxiliary gear, the gears do not rotate at positions other than the dead center.

In the first aspect of the present invention, the first and second engaging portions engage in a range, including the dead center position of the hand portion, in which the gears can rotate by almost the same angle (in a range of 180 degrees $-\theta_0 \leq \theta \leq 180$ degrees $+\theta_0$ when an angle between the first and second drive links is represented by $\theta$ and the angle range, in which the engagement of the first and second engaging portions is maintained, is represented by $-\theta_0$ to $+\theta_0$), so that a rotative force of the first or the second rotary shaft is transmitted to the first and second driven links. When the angle is beyond this range and the rotation angle of the gear provided at the first or second drive link and the rotation angle of the gear provided at the first or second driven link greatly differ, the engagement thereof is released, and the gear provided at the first or second drive link and the gear provided at the first or second driven link can rotate by different angles independently of each other.

On the other hand, in the transport apparatus according to the second aspect of the present invention, since the dead center escaping mechanism is provided, which affords the rotative force to the second arm only when passing the dead center position in which the first arms and the second arms are in parallel to each other, the passage through the dead center is smoothly performed with the second arm prevented from excess restraint. Therefore, the stable straight movement and increased transport accuracy of the substrate can be attained.

As shown in FIGS. 16(a) and (b), in the transport apparatus according to the second aspect of the present invention, a pair of the first arms 111, 112 are equal in length to each other; and its value is expressed by a distance between a rotation center $p_1$, $p_2$ of a rotating shaft 101, 102 and a rotation center $q_1$, $q_2$ of a second arm 121, 122 with respect to the first arm 111, 112, (that is an interaxial distance $a_1$, $a_2$ of the first arm 111, 112. $a_1 = a_2$).

Furthermore, a pair of the second arms 121, 122 are equal in length to each other, and its value is expressed by a distance between a rotation center $q_1$, $q_2$ of the second arm 121, 122 with respect to the first arm 111, 112 and a rotation center $s_1$, $s_2$ of the substrate supporting portion 104 with respect to the second arm 121, 122, (that is an interaxial distance $b_1$, $b_2$ of the second arm 121, 122. $b_1 = b_2$).

When the first arms 111, 112 are opened at an angle of 180 degrees, the angle formed by the second arms 121, 122 is also 180 degrees, so that the second arms 121, 122 are arranged on a straight line along which the first arms 111, 112 are arranged, and they are in parallel to each other.

If the distance e between the rotation centers $p_1$ and $p_2$ of a pair of the rotating shafts 101, 102 is equal to the distance d between the rotation centers $s_1$, $s_2$ of the substrate supporting portion 104 with respect to the second arms 121, 122 (e=d), then $a_1 = a_2 = b_1 = b_2$. If they are not equal (e≠d), then $a_1 = a_2 \neq b_1 = b_2$.

When an angle formed by the first arm 111, 112 and an angle formed by the second arm 121, 122, relative to the line segment connecting the rotation centers $q_1$, $q_2$ of a pair of the second arms 121, 122 relative to the first arms 111, 112 (or a line segment parallel to that line segment connecting the rotation centers $p_1$, $p_2$ of a pair of the rotating shafts 101, 102), are expressed by $\omega_1$ and $\omega_2$, respectively, $\omega_1 = \omega_2$ if the length of the first arm 111, 112 is equal to that of the second arm 121, 122 ($a_1 = a_2 = b_1 = b_2$).

On the other hand, when the length of the first arm 111, 112 is not equal to that of the second arm 121, 122 ($a_1 = a_2 \neq b_1 = b_2$), $\omega_1 \neq \omega_2$ at other than the dead center position in which the first arms 111, 112 and the second arms 121, 122 are opened at an angle of 180 degrees.

When the dead center escaping mechanism escapes from the dead center position by transmitting a rotative power of at least either one of the rotating shafts 101, 102 to at least either one of a pair of the second arms 121, 122, and when a rotative force is transmitted even at a place other than the dead center position in which the first arms 111, 112 and the second arms 121, 122 are opened at an angle of 180 degrees, the link mechanism cannot operate in the case where $\omega_1 \neq \omega_2$ because the rotative forces transmitted to the second arms 121, 122 from two directions are contradictory. Therefore, when $\omega_1 \neq \omega_2$, it is required for the transmission of the rotative force to be released at locations other than the dead center position.

Meanwhile, a posture control unit of a transport apparatus in FIG. 16(a) possesses gear members 133, 134 provided around rotation centers $s_1$, $s_2$ of a substrate supporting portion 104 with respect to the second arms 121, 122; and these gear members 133, 134 are fixed to a pair of the second arms 121, 122 and mesh with each other.

As shown in FIG. 16(b), a transport apparatus according to the second aspect of the present invention may comprise pulleys 143, 144 fixed to the second arms 121, 122 and a belt (or a chain) crossly-wound between the pulleys 143, 144 in the form of an "8" shaped configuration instead of the gear members 133, 134.

Effects of the Invention

In the first aspect of the present invention, the dead center escaping mechanism has a simple structure with a small thickness. Further, since the connecting portions of the hand portion can be made thin, an opening of a gate valve through which the arm portions are inserted can be made smaller. As a result, dust inside the transport chamber hardly enters the processing chamber.

In the first aspect of the present invention, since the first and second rotating shafts are arranged concentrically, the installation area for the apparatus is small, and the turning radius is small, so that the transport chamber in which this transport robot is arranged can be made smaller.

Further, in the first aspect of the present invention, since the first and second driven links and the hand portion are arranged in an offset manner, the connecting portions can be made thin for a reduced space and at a reduced cost.

Furthermore, since no restriction is posed for the dead center escaping mechanism at a position other than an area of 180 degrees $\pm \theta_0$, smooth operation is possible, and the sliding resistance of the gears, production of abrasion powder, etc. can be reduced. In addition, since none of the spring and linear guide is necessary, dust is much fewer.

Since the transport apparatus according to the second aspect of the present invention comprises the dead center escaping mechanism which affords the rotative forces upon the second arms only when passing the dead center position in which the first arms and the second arms are in parallel to each other, stable straight movement and improved transport accuracy can be attained by the excess restriction of the second arms, while providing the smooth passage of the dead center.

BRIEF DESCRIPTION OF THE DRAWINGS

FIGS. 14(a) to (c) are views for illustrating a frog leg type transport apparatus of the prior art in the second aspect.

BEST MODE FOR CARRYING OUT THE INVENTION

Best Mode of the Invention in the First Aspect

Figure 1:
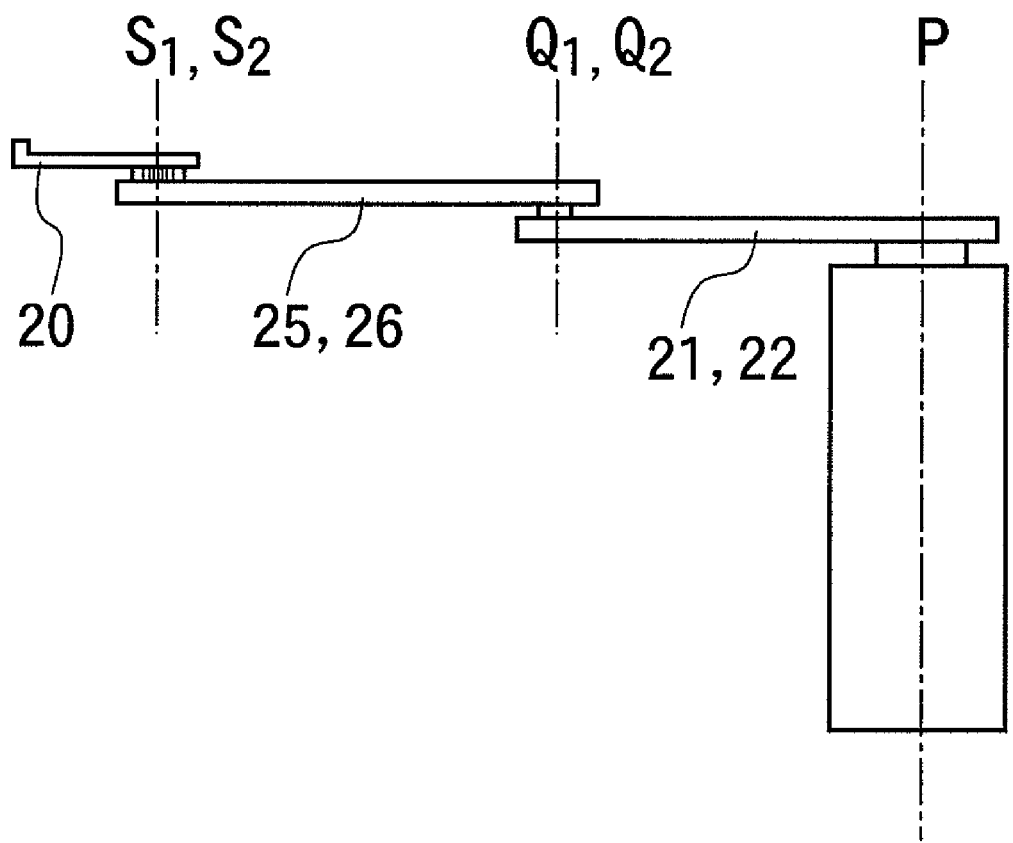
FIG. 1 is a side view of a transport robot as first and second embodiments according to the first aspect of the present invention.
Figure 2:
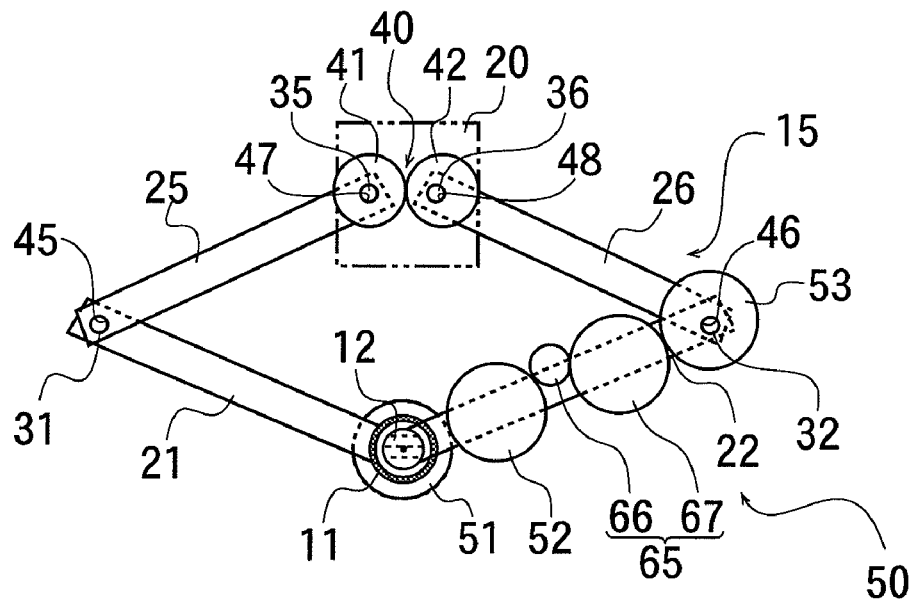
FIG. 2(a) is a plan view of the transport robot of the first embodiment.
FIG. 2(b) is a plan view of the transport robot according to the second embodiment.
Figure 2:
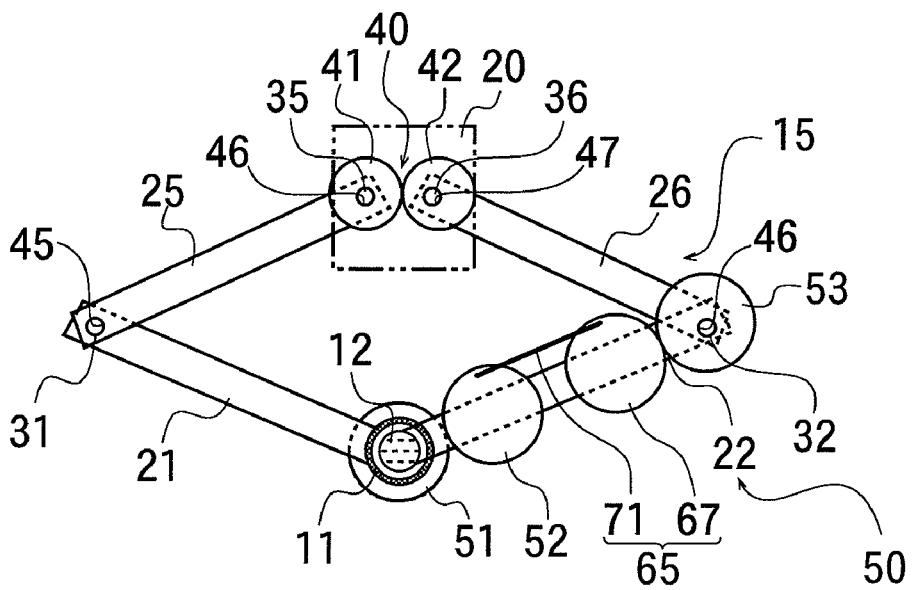

FIG. 1 shows a side view of transport robots (transport apparatuses) 1, 2 of first and second embodiments as the invention of the first aspect of the present invention. FIG. 2(a) shows a plane view of the transport robot 1 as the first embodiment; FIG. 2(b) shows a plane view of the transport robot 2 as the second embodiment; and explanation is made with the same reference numerals being given to the same members.

The transport robot 1, 2 comprises first and second rotary shafts 11, 12, and an arm portion 15.

One of the first and second rotary shafts 11, 12 is an outer cylinder, while the other is an inner cylinder; and the inner cylinder is arranged inside the outer cylinder. The first and second rotary shafts 11, 12 are respectively connected to motors (not shown), and can be independently rotated by the motors around the same driving rotary axis arranged perpendicularly, respectively.

Figure 3:
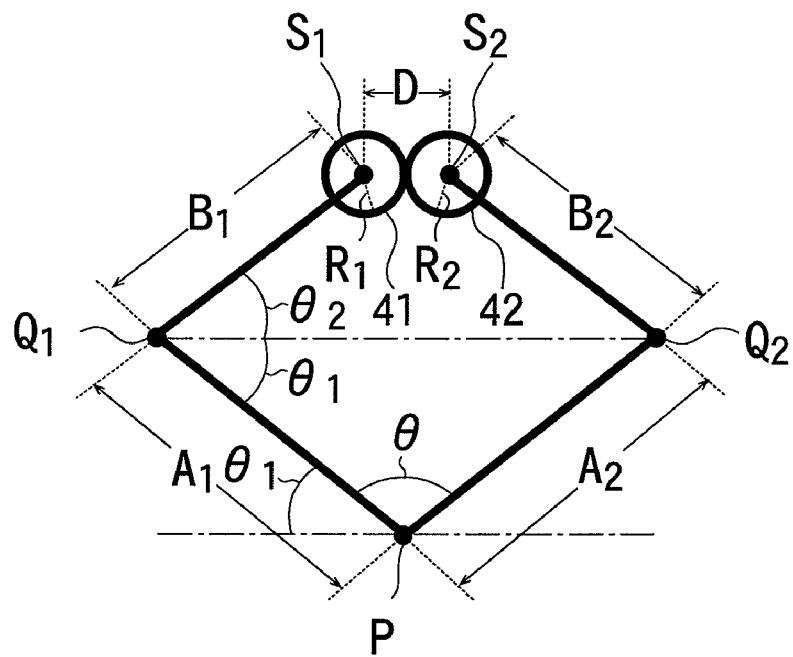
FIG. 3 is an explanatory drawing for illustrating rotating axes and interaxial distances of the transport robot in the first and second embodiments.

FIG. 3 is a schematic view for illustrating rotary axes and interaxial distances in the transport robot 1, 2 of the first and second embodiments, in which a sign P shows a driving rotary axis.

The arm portion 15 comprises first and second drive links 21, 22, first and second driven links 25, 26, and a hand portion 20.

The first and second drive links 21, 22 and the first and second driven links 25, 26 are elongated plates; the hand 20 is a plate having a rectangle shape approximate to a square shape; and its tip is attached with a substrate holding portion (not shown) for mounting an object to be transported.

Base portions of the first and second drive links 21, 22 are fixed to the first and second rotary shafts 11, 12 in a state such that they are extended in directions (horizontal directions, here) perpendicular to the driving rotary axis P. When the first and second rotary shafts 11, 12 rotate, the first and second drive links 21, 22 rotate around the driving rotary axis P by the rotary angle of the first and second rotary shafts 11, 12 in the same directions as the first and second rotary shafts 11, 12.

Holes 45, 46 are formed in the tip ends of the first and second drive links 21, 22 and base portions of the first and second driven links 25, 26, respectively; and the tips of the first and second drive links 21, 22 and the base portions of the first and second driven links 25, 26 are superimposed so as to communicate with the holes 45, 46. The first and second driven links 25, 26, respectively, are fitted rotatably to the first and second drive links 21, 22, respectively, by first and second main shaft members 31, 32 inserted into the holes 45, 46.

Therefore, nodes between the first and second drive links 21, 22 and the first and second driven links 25, 26 are located on first and second main rotary axes as central axes of the first and second main shaft members 31, 32; and the first and second driven links 25, 26 are rotatable around the first and second main rotary axes. Signs $Q_1, Q_2$ in FIG. 3 show first and second main rotary axes.

The first and second main rotary axes $Q_1, Q_2$ are in parallel to the driving rotary axis P; and the first and second driven links 25, 26 are extended in a direction vertical to the first and second main rotary axes $Q_1, Q_2$. Therefore, the first and second driven links 25, 26 rotate in a plane vertical to the first and second main rotary axes $Q_1, Q_2$.

Further, holes 47, 48 are formed in tips of the first and second driven links 25, 26 and right and left opposite end positions of the hand portion 20.

The first and second driven links 25, 26 are superimposed on the hand portions 20 in a state such that the holes 47, 48 in the tips of the first and second driven links 25, 26 are communicated with the holes 47, 48 in one and the other ends of the hand portion 20, respectively; and the first and second driven links and the hand portion are connected by first and second auxiliary shaft members 35, 36 inserted into the holes 47, 48.

The hand portion 20 is rotatable, relative to the first and second driven links 25, 26, around first and second auxiliary rotary axes as the center axes of the first and second auxiliary shaft members 35, 36. Signs $S_1, S_2$ of FIG. 3 denote the first and second auxiliary rotary axes, respectively.

Therefore, the tip portions of the first driven link 25 and the second driven link 26 are connected via the hand portion 20.

The first and second auxiliary rotary axes $S_1, S_2$ are in parallel to the driving rotary axis P; and the hand portion 20 is arranged vertically to the first and second auxiliary rotary axes $S_1, S_2$.

A posture control unit 40 is attached between the first and second driven links 25, 26 and the hand portion 20.

The posture control unit 40 is constructed by first and second restraint gears 41, 42 fixed to the first and second driven links 25, 26, respectively, and meshing with each other. The first and second restraint gears 41, 42 are arranged on the first and second auxiliary rotary axes $S_1, S_2$ as the rotary centers. The first and second restraint gears 41, 42 are able to rotate, together with the rotations of the first and second driven links 25, 26, relative to the hand portion 20 around the first and second auxiliary rotary axes $S_1, S_2$.

In FIG. 3, the signs $A_1, A_2$ denote the distances (interaxial distances) between the driving rotary axis P and the first and second main rotary axes $Q_1, Q_2$, respectively; and the interaxial distances $A_1, A_2$ are the lengths of the first and second drive links 21, 22, respectively.

Further, signs $B_1, B_2$ in the same figure denote the distance (interaxial distance) between the first main rotary axis $Q_1$ and the first auxiliary rotary axis $S_1$ and the distance (interaxial distance) between the second main rotary axis $Q_2$ and the second auxiliary rotary axis $S_2$, respectively; and the interaxial distances $B_1, B_2$ are the lengths of the first and second driven links 25, 26, respectively.

Meanwhile, signs $R_1, R_2$ of the same figure are radii of the first and second restraint gears 41, 42; the first and second restraint gears 41, 42 are meshed together; and the total value of the radii $R_1, R_2$ of the first and second restraint gears 41, 42 is the distance D (interaxial distance) between the first and second auxiliary rotary axes ($D=R_1+R_2$).

In the present invention, the radii $R_1, R_2$ of the first and second restraint gears 41, 42 are equal in magnitude and are a half value of the interaxial distance D between the first and second auxiliary rotary axes $S_1, S_2$, respectively, ($R_1=R_2=D/2$).

In addition, in the present invention, the lengths $A_1, A_2$ of the first and second drive links 21, 22 are equal to each other ($A_1=A_2$), and the lengths $B_1, B_2$ of the first and second driven links 25, 26 are equal to each other ($B_1=B_2$).

When an angle formed by the first and second drive links 21, 22 is expressed by a sign θ, in a case of θ=180 degrees, the interaxial distances $A_1, A_2$ of the first and second drive links 21, 22 are arrayed in a straight line, and both of their ends form a line segment positioned between the first and second main rotary axes $Q_1, Q_2$.

Since the same line segment is formed by the interaxial distance $B_1$ of the first driven link 25, the interaxial distance D between the first and second auxiliary rotary axes $S_1, S_2$ and the interaxial distance $B_2$ of the second driven link 26, $A_1+A_2=B_1+D+B_2$ ($A_1=A_2$, $B_1=B_2$) Since $D>0$, $B_1=B_2<A_1=A_2$.

In the case that there is the following relationship: $A_1=A_2$ and $B_1=B_2$ regarding the interaxial distances, the line segment connecting the rotation centers of the first and second restraint gears 41, 42 can be made parallel to a straight line vertically crossing the first and second main rotary axes $Q_1, Q_2$.

In this state, the first and second restraint gears 41, 42 mesh with each other, the angle formed by the line segment connecting the rotation centers of the first and second restraint gears 41, 42 and the first driven link 25 is equal to the angle formed by the above line segment and the second driven link 26; and the angle formed by the first drive link 21 and the first driven link 25 is equal to the angle formed by the second drive link 22 and the second driven link 26.

When the first and second rotary shafts 11, 12 rotate and the angle formed by the first and second drive links 21, 22 varies, the first and second restraint gears 41, 42 rotate by the same angle in mutually opposite directions, while the state, in which the angle formed by the line segment connecting the rotation centers of the first and second restraint gears 41, 42 and the first driven link 25 is equal to the angle formed by the above line segment and the second driven link 26, is maintained. Therefore, the same portion of the hand portion 20 is directed to the first and second rotary shafts 11, 12; and the contact point between the first and second restraint gears 41, 42 is on a straight line dividing the angle formed by the first and second drive links 21, 22 into two.

When the angle formed by the first and second drive links 21, 22 is 180 degrees, the contact point between the first and second restraint gears 41 and 42 is located on the driving rotary axis P. This state is a state in which the hand portion 20 is positioned on the dead center.

When the first and second rotary shafts 11, 12 rotate from this state and the first and second drive links 21, 22 move so as to be closed, the hand portion 20 can move in either direction in which the first and second drive links 21, 22 are closed or in an opposite direction thereof.

Which direction the hand portion 20 moves in is not determined only by the rotations of the first and second rotary shafts 11, 12, so that if the first and second drive links 21, 22 move in the direction reverse to the closing direction, the arm portion 15 does not expand.

In the present invention, a dead center escaping mechanism 50 is provided between the first or second drive link 21, 22 and the second driven link 26. When the first and second drive links 21, 22 close from 180 degrees, the first or second driven links 25, 26 is rotated by the dead center escaping mechanism 50 so that the hand portion 20 may move in a direction identical with a direction in which the first and second drive links 21, 22 close.

Explanation is made of the dead center escaping mechanism 50, which comprises a drive disc 51 fitted to the first drive link 21, and a driven disc 52 adjacent to the drive disc 51 and fitted to the second drive link 22.

The drive disc 51 has its center arranged on the driving rotary axis P, and is fixed to the first rotary shaft 11 and the first drive link 21, so that when the first drive link 21 rotates, the drive disc 51 is rotated around the driving rotary axis P by the same angle in the same direction as for the first drive link 21.

The driven disc 52 has a rotation center fitted rotatably to the second drive link 22; and this rotation center rotate in a state such that the rotation center is stationary relative to the second drive link 22.

Figure 5:
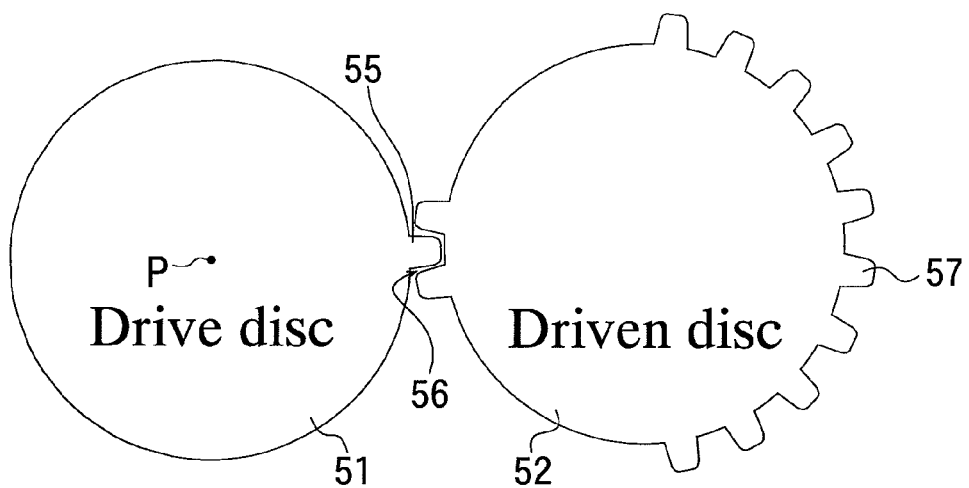
FIG. 5(a) is a plan view for showing a state in which first and second engaging members engage.
FIG. 5(b) is a plan view for showing a state in which the first and second engaging members are disengaged.
Figure 5:
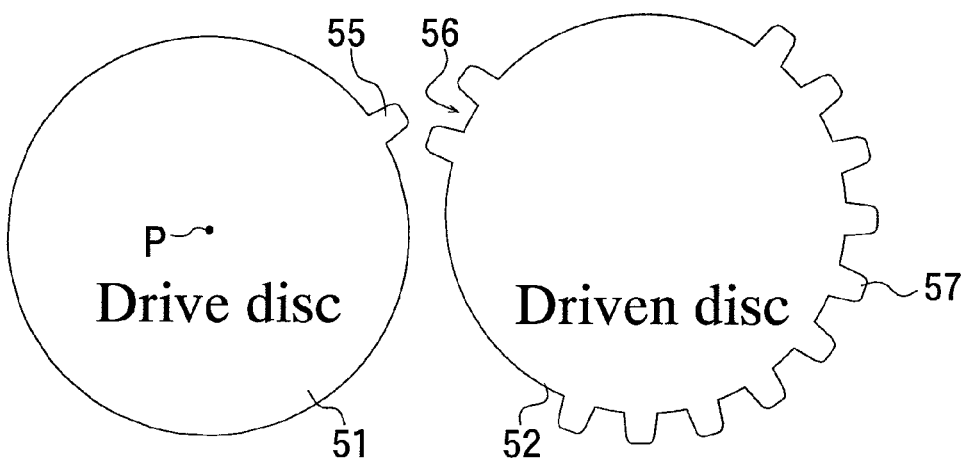

As shown in FIGS. 5(a) and (b), circumferential side faces of the drive disc 51 and the driven disc 52 are provided with first and second engaging members 55, 56, respectively.

As to the first and second engaging members 55, 56, one is a projection, and the other is a depression. (In FIGS. 5(a) and (b), the first engaging member 55 is the projection, and the second engaging member 56 is the depression.) The relative positional relationship between the first and second engaging members 55, 56 is set such that when the angle between the first and second drive links 21, 22 forms 180 degrees (that is, when the hand portion 20 is located at the dead center), they are engaged (with the projection being caught in the depression). FIG. 5(a) shows the state in which the first and second engaging portions 55, 56 are engaged.

When the first and second rotary shafts 11, 12 relatively rotate and turn in the closing direction from the state in which the angle between the first and second drive links 21, 22 is 180 degrees, the rotation center of the driven disc 52 makes a circular motion around the driving rotary axis P, and the position where the drive disc 51 is in contact with the driven disc 52 moves.

At this time, the second engaging member 56 receives a rotative force from the first engaging member 55 of the drive disc 51 until the engagement thereof is released, so that the second engaging member is rotated by the same angle in the direction opposite to the rotation of the first drive link 21 relative to the second drive link 22. FIG. 5(b) shows the state in which the engagement thereof is released.

The driven disc 52 is provided with neither projections nor depressions other than the second engaging member 56 in a semicircular area of the circumferential side face around the second engaging member 56, whereas gear teeth 57 are provided in a semicircular area (a central angle: 180 degrees) on the opposite side of the second engaging member 56.

The second driven link 26 is provided with a driven gear wheel 53 which rotates around the second main rotary axis $Q_2$.

A transmission mechanism 65 is arranged between the driven disc 52 and the driven gear wheel 53 so that when the first engaging member 55 rotates the second engaging member 56, the rotative force of the second engaging member 56 rotates the driven gear wheel 53 via those members which mesh the teeth 57 of the driven disc 52 or mesh the driven wheel 53 in the transmission mechanism 65.

In this embodiment, the transmission mechanism 65 comprises a first transmission gear wheel 66 meshing with the teeth 57 of the driven disc 52 and a second transmission gear wheel 67 meshing with both the first transmission gear wheel 66 and the driven gear wheel 53, so that the teeth 57 of the driven disc 52 is connected with the driven gear wheel 53; the rotation of the drive disc 51 is converted by the driven disc 52 and the first and second transmission gear wheels 66, 67; and the driven gear wheel 53 is rotated in the same direction as the direction the first drive link 21 is rotated.

The first transmission gear wheel 66 has a diameter smaller than that of the driven disc 52, so that when the second driven link 26 rotates by ±90 degrees at a maximum, the first transmission gear wheel 66 is in contact with an area of not greater than a semicircle of the driven disc 52.

As shown in FIG. 2(b), it may be that instead of the first transmission gearwheel 66, the second transmission gear wheel 67 meshing with the driven gear wheel 53 is replaced by a rod 71 provided rotatably near the outer circumference of the driven disc 52 and the outer circumference of the second transmission gear wheel 67; and the driven disc 52 and the second transmission gear wheel 67 connected by the rod 71 are rotated by the same angle in the same direction. In this case, the teeth 57 of the driven disc 52 are unnecessary.

The direction of the rotative force of the driven gear wheel 53 is the same as the rotating direction of the first drive link 21 relative to the second drive link 22. For instance, when the first drive link 21 rotates clockwise relative to the second drive link 22, the driven gear wheel 53 is rotated clockwise, whereas when the first drive link 21 rotates counterclockwise relative to the second drive link 22, the driven gear wheel 53 is rotated counterclockwise.

As a result, the hand 20 is moved toward the direction in which the first and second drive links 21, 22 close, and the arm portion 15 is expanded, so that if the first and second drive link 21, 22 close, an escape error in which the hand portion 20 is kept stationary on the dead center is prevented.

Since the length of the first and second drive links 21, 22 differs from that of the first and second driven links 25, 26, when the angle between the first and second drive links 21, 22 is out of 180 degrees, the first and second rotary shafts 11, 12 rotate relative to each other, the first and second drive links 21, 22 rotate by $\theta_1$, respectively, and the first and second driven links 25, 26 and the driven gear wheel 53 rotate around the main rotary axis by an angle $\theta_2$ different in magnitude from $\theta_1$ ($\theta_2 > \theta_1$). Since the driven gear wheel 53 and the driven disc 52 are connected by the teeth 57 and the transmission mechanism 65, the rotative force of the driven gear wheel 53 is transmitted to the driven disc 52.

Therefore, when $\theta$ is 180 degrees, such a rotative force is applied to the driven disc 52 by means of the first and second engaging members 55, 56 so that it is rotated by an angle according to the rotation angle $\theta_1$ of the first and second drive link 21, 22. When $\theta$ is not 180 degrees, such a rotative force is applied to the driven disc 52 by means of the driven gear wheel 53 via the transmission mechanism 65 so that it is rotated by an angle according to the rotation angle $\theta_2$ of the first and second driven link 25, 26.

Assuming that the first and second engaging members 55, 56 keep engaged when the open angle $\theta$ between the first and second drive links 21, 22 is in a range of 180 degrees $-\theta_0 \leq \theta \leq 180$ degrees $+\theta_0$, the driven disc 52 receives the forces from both the first engaging member 55 and the transmission mechanism 65, during the above-mentioned range excluding θ=180 degrees, the forces being in the same direction but causing rotations at different angles. Preferably, it is ideal that $\theta_0$ is 0 degree. However, since it is difficult to produce the engaging members with $\theta_0$=0 degree, the first and second engaging members 55, 56 are formed in the present invention such that $\theta_0$ is 16 degrees or less in order to assuredly transmit the driving force at the position of θ=180 degrees. Therefore, allowance between the first and second engaging members 55, 56 in the present invention and an allowance inside the transmission mechanism 65 or the like absorb the difference in angles, whereby neither the first and second engaging members 55, 56 nor the teeth 57 may be broken.

In the case where the angle θ between the first and second drive links 21 and 22 is in an angle range from 0 degree or more to less than 180 degrees $-\theta_0$ or from more than 180 degrees $+\theta_0$ to 360 degrees or less, the engagement between the first and second engaging members 55, 56 is released, so that the second engaging member 56 does not receive the force from the first engaging member 55.

In this state, the driven disc 52 is rotated by a rotative force transmitted from the driven gear wheel 53 via the transmission mechanism 65. This rotation is done by the same rotation angle in the same direction as for the first driven link 25 (by the same angle in the direction opposite to the rotation angle of the second driven link 26).

On the other hand, the drive disc 51 rotates by the same angle in the same direction as the rotation of the first drive link 21 (i.e., rotates by the same angle in direction opposite to the rotation angle of the second drive link 22), so that when the first and second drive links 21, 22, which are located at the positions where the first and second engaging members 55, 56 do not engage, are returned to the position where the angle between them is the open angle of 180 degrees, the first and second engaging members 55, 56 engage again.

Figure 6:
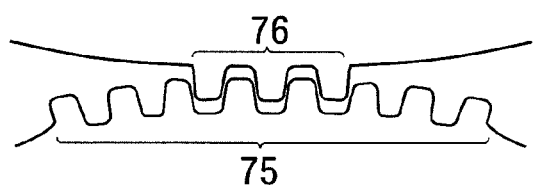
FIG. 6 is a plane view of another embodiment of the first and second engaging members.
Figure 7:
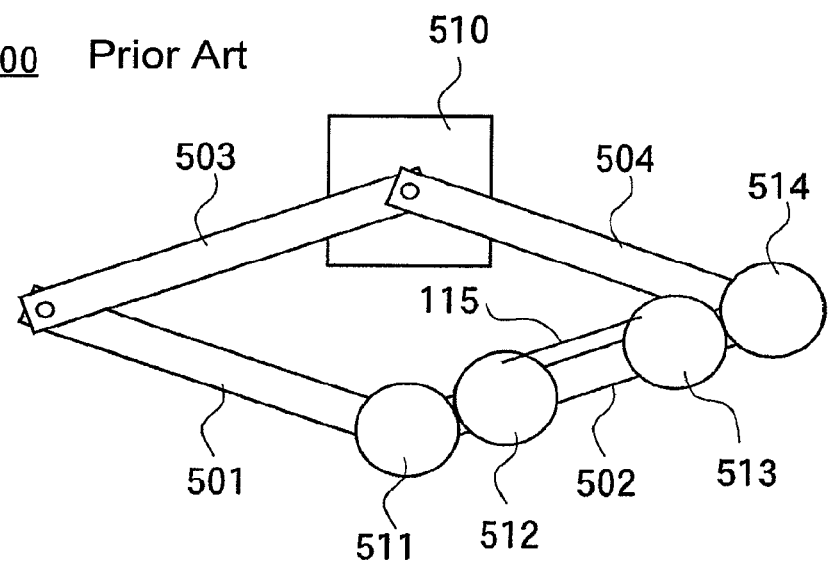
FIG. 7 is a plan view for illustrating an example of the transport apparatus of the prior art in the first aspect.
Figure 8:
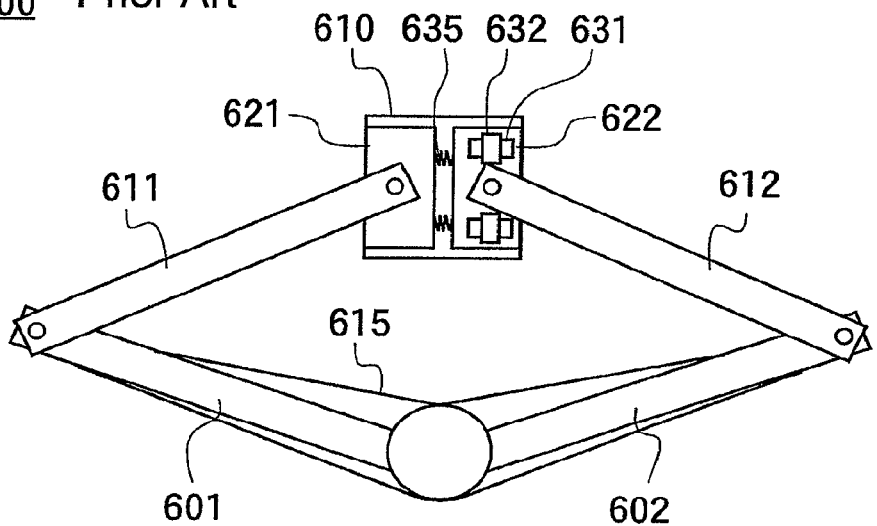
FIG. 8 is a plan view illustrating another example of the transport apparatus of the prior art in the first aspect.

The first and second engaging members 55, 56 are constituted by the projection and the depression. However, as shown in FIG. 6, one of the first and second engaging members 75, 76 may be the gear wheel, and the other may be a projection or depression for engaging with the gear wheel.

Figure 4:
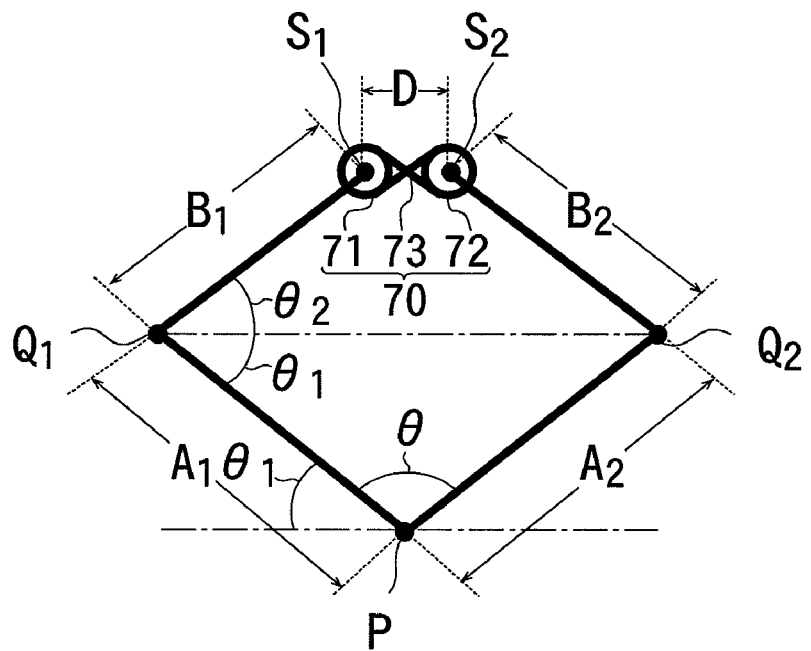
FIG. 4 is an explanatory drawing for illustrating another embodiment of the posture control unit.

The above posture control unit 40 comprises the mutually meshed same-radius gears having the first and second auxiliary rotation centers $s_1, s_2$ as rotation centers. As shown in FIG. 4, a posture control unit 70 may be employed. The posture control unit 70 is comprised of first and second auxiliary discs (pulleys) 71, 72, each having a size smaller than ½ of the interaxial distance between the first and second auxiliary rotary axes $s_1, s_2$, which are fixed to the first and second driven links 25, 26, and are connected by a belt 73 (a chain in the case that the first and second auxiliary discs 71, 72 have sprockets) cross wound therebetween in an "8" figure fashion.

The first and second auxiliary discs 71, 72 rotate around the first and second auxiliary rotary axes $S_1, S_2$, respectively, by the same angle in the same direction as the first and second driven links 25, 26.

In this case, the above-described first and second driven links 21, 22 and the first and second links 25, 26 are elongated plates, and their surfaces are arranged horizontally so that they can pass narrow gate valves, but they may also be rod-shaped members.

In order that the transport apparatuses 1, 2 of the present invention may be used in apparatuses for processing in vacuum (such as, a semiconductor producing apparatus, etc.), the apparatus side must be kept in a vacuum state. Since a driving source is placed on an atmospheric side in order to maintain the apparatus side in a vacuum state, a rotation introducing mechanism is required, which comprises a rotation seal for transmitting a rotative force of the driving source placed on the atmospheric side to the first and second rotary shafts 11, 12 on the vacuum side.

In the present invention, the rotation introducing mechanism is disposed between the first and second rotary shafts 11, 12 and a housing. It may be constructed by the combination of a resin seal and an O-ring seal as a contact-type rotation seal, or the number of the vacuum seals may be increased depending on the required pressure of the apparatus side. Alternatively, an intermediate evacuation may be performed, or other rotation introducing mechanism (such as, a magnetic fluid seal) may be used.

Moreover, in order to produce the rotative force to be applied to the second driven link 26, the drive disc 51 having the driving rotary axis P as the center is fixed to the first drive link 21 in the above-described embodiment. However, it may be that when at least the second drive link 22 is rotated in getting rid of the dead center by expanding the arms, the drive disc 51 having the driving rotary axis P as the center is fixed to the vacuum chamber, the first and second engaging members 55, 56 may be arranged on the drive disc 51 and the above-described driven disc 52 provided rotatably on the second drive link 22, in order to produce the rotative force to be applied to the second driven link 26.

Best Mode of the Invention in the Second Aspect

Hereinafter, respective embodiments of the invention of the second aspect of the present invention will be explained in reference to the drawings. The transport apparatus according to the present embodiment is placed inside the vacuum transport chamber in the multi-chamber apparatus having the plural vacuum processing chambers arranged around the vacuum transport chamber; and the transport apparatus of the present embodiment is the transport apparatus in which the substrates are automatically transported among the plural vacuum processing chambers including a loading/unloading chamber (not shown).

[First Embodiment]

Figure 9:
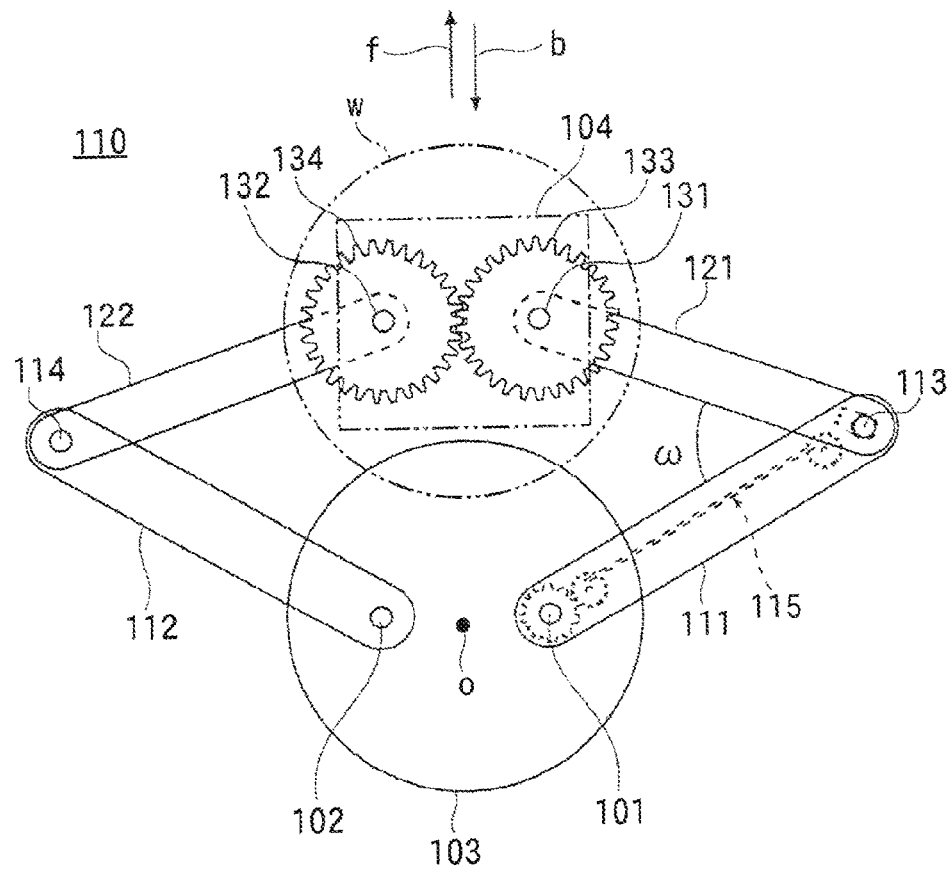
FIG. 9 is a schematic plan view of a transport apparatus according to the first embodiment of the second aspect of the present invention.

FIG. 9 shows a transport apparatus 110 according to a first embodiment of the second aspect of the present invention.

The transport apparatus 110 of this embodiment comprises a base 103 provided with a pair of rotating shafts 101, 102 rotating in mutually different directions, a pair of first arms 111, 112 having one ends connected to the rotating shafts 101, 102, respectively, a pair of second arms 121, 122 having one ends connected rotatably to the other ends of these first arms 111, 112 via arm-connecting shafts 113, 114, respectively, and a substrate supporting portion 104 connected rotatably to the other ends of these second arms 121, 122, respectively.

The arm length of each of the first arms 111, 112 and the arm length of each of the second arms 121, 122 are the same; thus a parallel linkage mechanism is formed by them. Therefore, an angle ω formed by the first arms 111, 112 and the second arms 121, 122 varies through the rotation of the rotating shafts 101, 102 in mutually opposite directions, so that the substrate supporting portion 104 is moved vertically in the figure. Such a structural arrangement allows for a substrate w on the substrate supporting portion 104 to be transported to an arbitrary position. The base 103 is able to rotate around its axis o together with the rotating shaft 101, 102. By the rotation of the base 103, the substrate supporting portion 104 is rotated and moved around the base 103.

In the present embodiment, gear members 133, 134 are fixed around connecting shafts 131, 132 connecting the other ends of the respective second arms 121, 122 to the substrate supporting portion 104. These gear members 133, 134 mesh with each other, and are rotatable in mutually opposite directions, thereby constituting a posture holding mechanism for keeping the posture of the substrate supporting portion 104 constant during the rotations of the second arms 121, 122.

In this case, it may be that driving sources (not shown) (such as, driving motors) are connected to both the rotating shafts 101, 102 for independent rotation thereof, or while the driving source is connected to either one of them, the rotation of the other rotary shaft is kept still.

Figure 15:
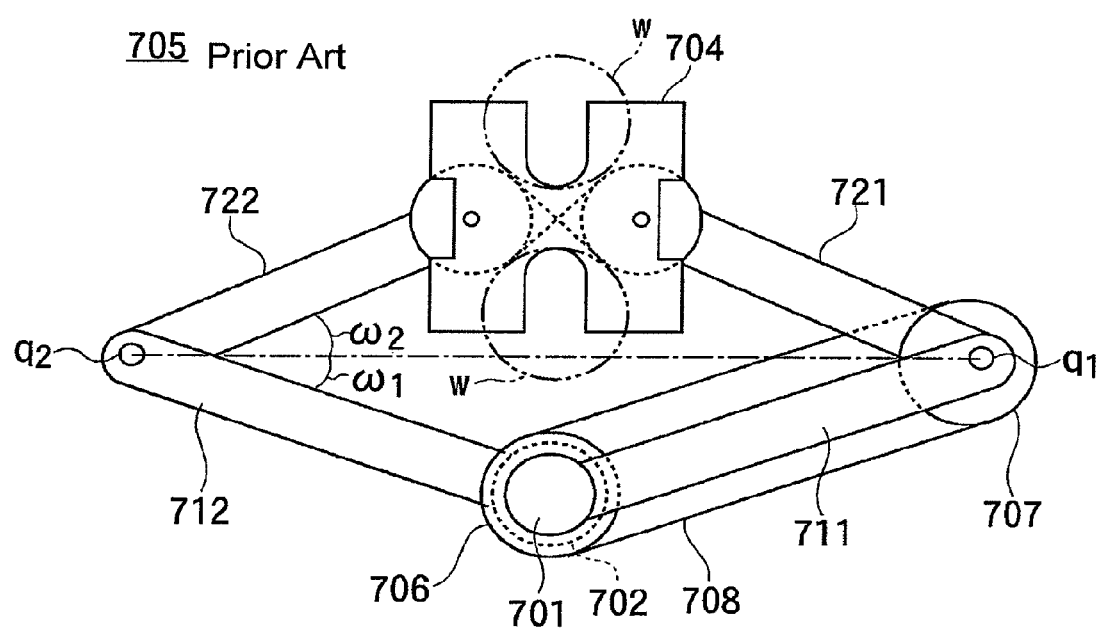
FIG. 15 is a schematic plan view of a transport apparatus equipped with a dead center escaping mechanism in the second aspect of the prior art.
Figure 16:
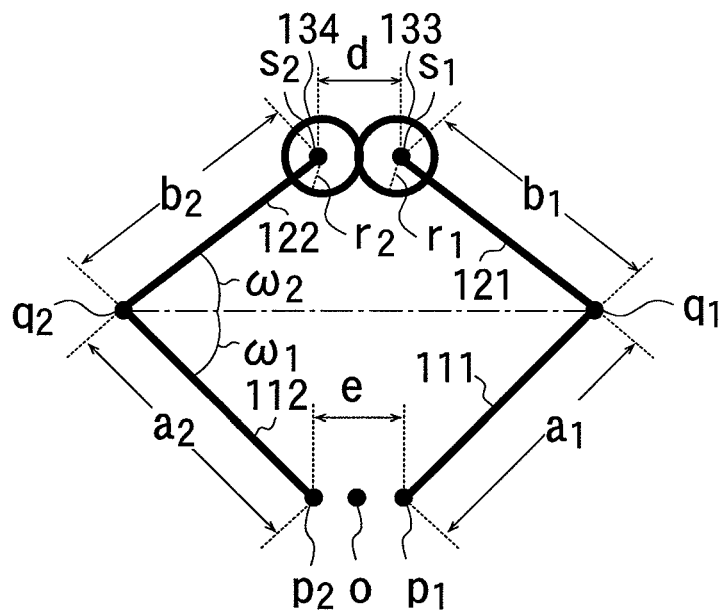
FIGS. 16(a) and (b) are figures for illustrating lengths and rotation centers of first and second arms, while omitting the showing of a dead center escaping mechanism: (a) in a case where a posture control unit composed of gears is provided; (b) in a case where a posture control unit composed of pulleys and a belt is provided.
Figure 16:
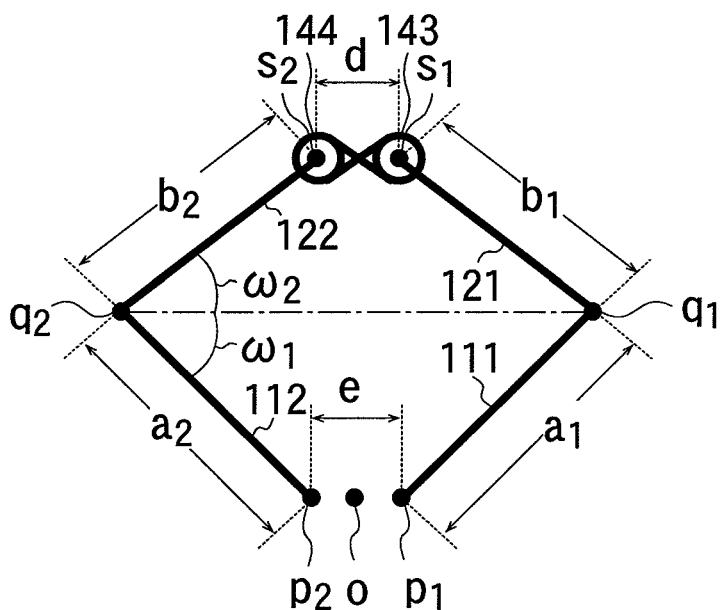

The transport apparatus can be constructed by arranging the rotating shafts 101, 102 on the same shaft center. In this case, for example, as shown in FIG. 15, one rotating shaft 101 is arranged on an inner circumferential side, and the other rotating shaft 102 is arranged on the outer circumferential side.

In this case, these rotating shafts 101, 102 are both connected to the driving sources, and the substrate supporting portion 104 is moved in a front-back direction by rotating the rotating shafts 101, 102 in the relatively opposite directions, whereas when they rotate in the same direction, the substrate supporting portion 104 rotatably moves.

Furthermore, in the illustrated embodiment, the substrate supporting portion 104 is able to mount a single substrate w. However, it may be able to mount two substrates as shown in FIG. 15. Further, the shape of the substrate supporting portion 104 is not limited to the illustrated embodiment, but it can be appropriately changed to a fork shape or the like. As the substrate w, non-processed or already processed semiconductor wafer substrates, glass substrates or the like are applied.

In such a frog leg type transport apparatus 110, when the substrate w is to be transported from a forward position (an upper position in the figure) to a rearward position (a lower position in the figure) with respect to the base 103, the substrate w needs to pass the dead center position where a pair of the first arms 111, 112 and a pair of the second arms 121, 122 are in parallel to each other ($\omega$=0 degree). Therefore, the transport apparatus 110 of the present embodiment is provided with the dead center escaping mechanism 115, as described later, in order to smoothly pass this dead center position.

Figure 10:
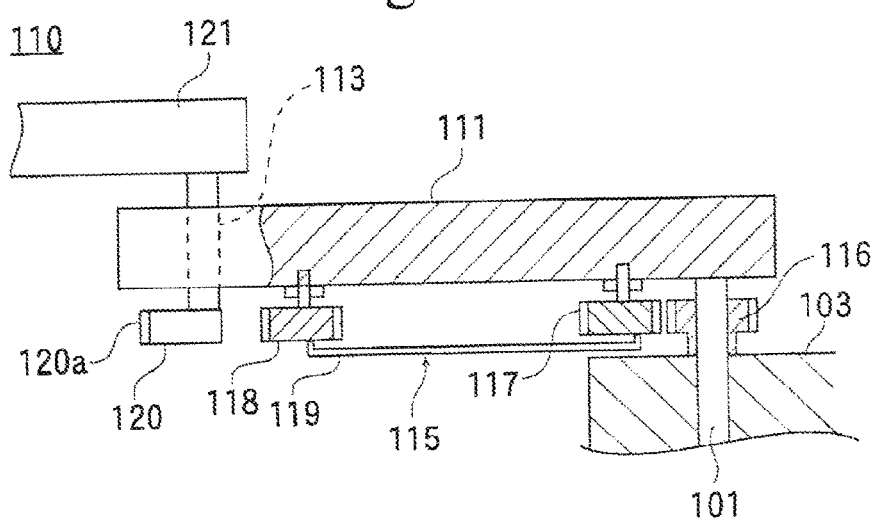
FIG. 10 is a sectional side view of a principal portion of the transport apparatus.
Figure 11:
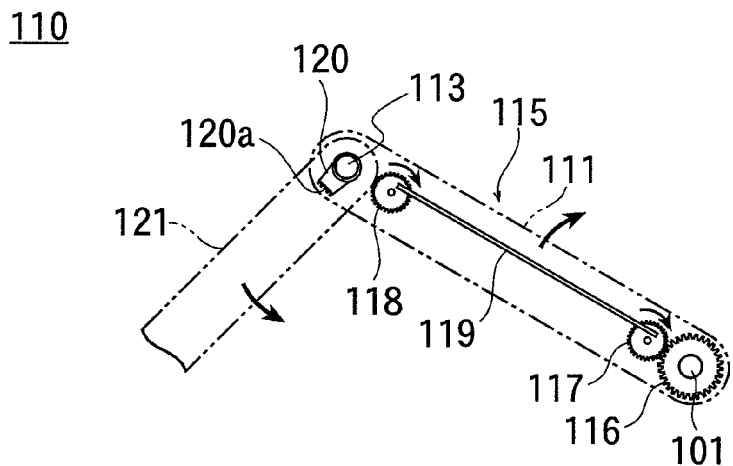
FIGS. 11(a) to (c) are plan views of principal portions for illustrating the function of a dead center escaping mechanism of a transport apparatus in the second aspect.
Figure 11:
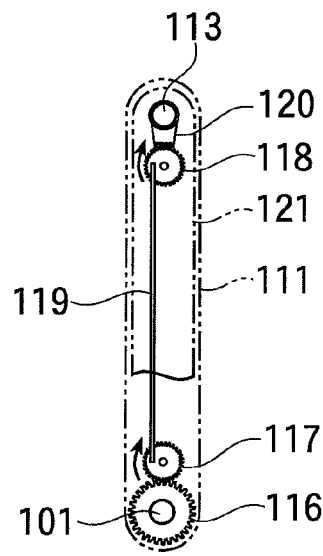
Figure 11:
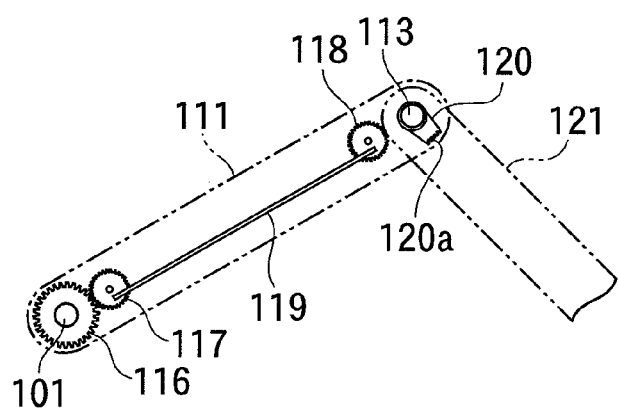

FIG. 10 and FIG. 11 show the construction of the dead center escaping mechanism 115. In this embodiment, FIG. 10 is a side view of a principal portion of the transport apparatus 110, and FIG. 11 is a plan view of a principal portion for illustrating the function of the dead center escaping mechanism 115.

In the present embodiment, the dead center escaping mechanism 115 is configured so as to afford a rotative force upon a second arm 121 only when passing the dead center position, where a pair of the first arms 111, 112 and a pair of the second arms 121, 122 are in parallel to each other. The dead center escaping mechanism 115 is provided on the first arm 111 and the second arm 121 on one side, respectively, but it may be provided on the first arm 112 and the second arm 122 on the other side, respectively.

The base 103 is provided with a fixed gear 116 which is arranged concentrically with the rotating shaft 101 for rotating the first arm 111. In the vicinity of one end of the downward faced side of the first arm 111, a first rotary gear 117, which meshes with a circumference of the fixed gear 116, is rotatably supported. The first rotary gear 117 rotates like a planet gear, circling around the fixed gear 116 accompanying the rotation of the first arm 111. A second rotary gear 118 is rotatably supported in the vicinity of the other end of the downward faced side of the first arm 111. A link (lever) 119 is connected between the second rotary gear 118 and the first rotary gear 117, and a rotative force of the first rotary gear 117 is transmitted to the second rotary gear 118 via the link 119.

The "rotation driving portion" according to the second aspect of the present invention is constructed by these fixed gear 116, first rotary gear 117, second rotary gear 118 and link 119. The link 119 is one example of the "rotative force transmission member" in the second aspect of the present invention, and it may be constituted by, for example, a belt member except the link.

On the other hand, an engaging gear 120, which engages with the second rotary gear 118 when the second arm 121 is at a predetermined rotation angle (rotation phase), is fixed to a lower end of an arm connecting shaft 113 that connects the other end of the first arm 111 with one end of the second arm 121. The arm connecting shaft 113 is fixed to the second arm 121, and rotates relatively to the first arm 111. The engaging gear 120 corresponds to the "engaging portion" in the second aspect of the present invention, and has engaging teeth 120a, which is partially engageable with the second rotary gear 118 at an outer circumferential portion. The engaging teeth 120a is arranged toward the extending direction of the second arm 121. As shown in FIG. 11(b), the engaging teeth 120a engage with the second rotary gear 118 only at the dead center position where the second arm 121 is superimposed on the first arm 111 to be in parallel with each other and at a predetermined angle range around the dead center position.

In the transport apparatus 110 of the present embodiment, constructed as described above, by the rotation of the rotating shafts 101, 102 in the mutually opposite directions, the parallel linkage mechanism, which is composed of a pair of the first arms 111, 112 and a pair of the second arms 121, 122 connected thereto, expands and shrinks. Consequently, the substrate w on the substrate supporting portion 104 is linearly transported in the front-back directions (the vertical directions in FIG. 9). More specifically, when the rotating shaft 101 rotates counterclockwise and the rotating shaft 102 rotates clockwise, the substrate w moves forwards in a direction f in FIG. 9. On the other hand, when the rotating shaft 101 rotates clockwise and the rotating shaft 102 rotates counterclockwise, the substrate w moves backwards in a direction b in FIG. 9.

In the dead center escaping mechanism 115, as shown in FIG. 11(a), the first rotary gear 117 meshing with the fixed gear 116 rotates accompanying the rotation of the first arm 111, and its rotative force is transmitted to the second rotary gear 118 via the link 119. When the substrate supporting portion 104 is linearly moved at a forward position relative to the base 103 as shown in FIG. 9, the engaging teeth 120a of the engaging gear 120 does not engage with the second rotary gear 118, so that the second arm 121 rotates by a rotation angle corresponding to the rotation angle of the first arm 111 without receiving any restraint force from the rotating shaft 101.

On the other hand, when the substrate supporting portion 104 is transported relative to the base 103, from the forward position to a backward position of the base 103 as shown in FIG. 9, a pair of the second arms 121, 122 passes the dead center position of the linkage in which they become in parallel with the first arms 111, 112, respectively. In this case, the engaging gear 120 engages with the second rotary gear 118, which rotates accompanying the rotation of the first arm 111 (FIG. 11(b)). The second arm 121 receives a predetermined axial torque in the rotating direction of the second rotary gear 118 via the engaging gear 120, thereby enabling the smooth passage through the dead center position shown in FIG. 11(b) (see also, FIG. 11(c)).

Meanwhile, when the substrate supporting portion 104 is moved from the rearward position of the base 103 to the forward position, a function similar to the above is performed. In this case, the rotating direction of the second rotary gear 118 is the reverse direction to the above.

Therefore, since the transport apparatus 110 of the present embodiment is equipped with the dead center escaping mechanism 115, which gives the rotative force to the second arm 121 only when passing the dead center position in which a pair of the first arms 111, 112 and a pair of the second arms 121, 122 are in parallel to each other, the stable linear movement and improvement of the transport accuracy for the substrate w can be ensured by the smooth passage through the dead center and by the prevention of excessive restraint of the second arm 121 during the passage of the non-dead center portion.

In addition, according to the transport apparatus 110 of the present embodiment, when the second arms 121, 122 stop once at the dead center position and the second arms 121, 122 are moved again from this dead center position, the second arms 121, 122 can smoothly move through the reception of the imparting effect of the rotative force by the above dead center escaping mechanism 115.

[Second Embodiment]

Figure 12:
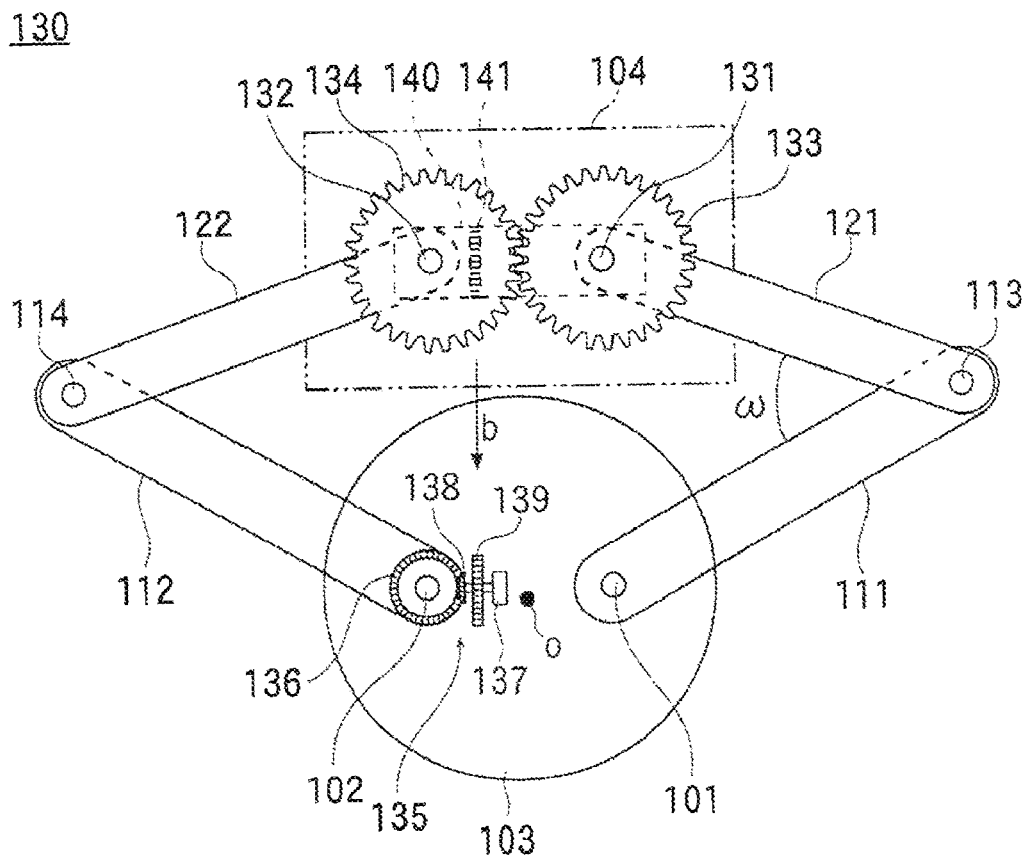
FIG. 12 is a schematic plan view of a transport apparatus according to the second embodiment of the second aspect of the present invention.
Figure 13:
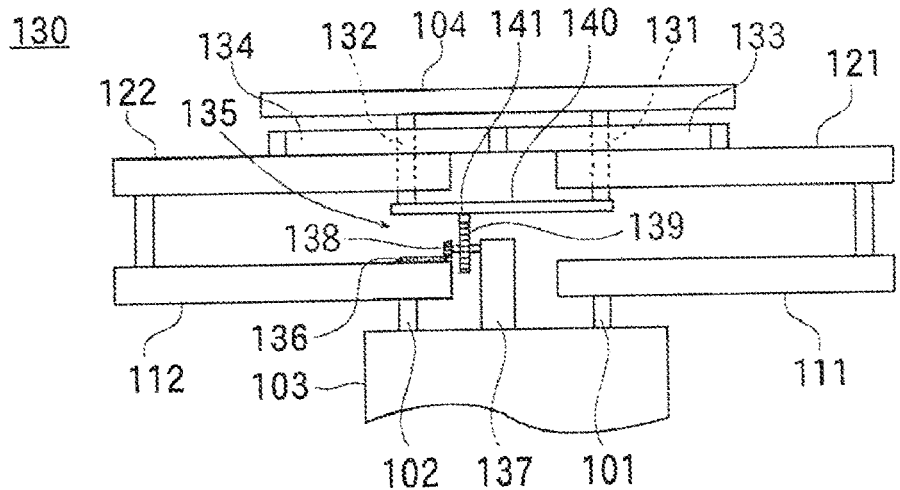
FIG. 13 is a front view of this transport apparatus.

FIG. 12 and FIG. 13 illustrate the construction of a transport apparatus 130 according to a second embodiment of the second aspect of the present invention. FIG. 12 is a plan view of the transport apparatus 130; and FIG. 13 is a front view of the transport apparatus 130. In each of the figures, the same reference numerals are given to portions corresponding to the above-described first embodiment.

Also, similar to the above-described first embodiment, the transport apparatus 130 of the present embodiment comprises a base 103 provided with a pair of rotating shafts 101, 102 to rotate in mutually different directions, a pair of first arms 111, 112 having one ends connected to the rotating shafts 101, 102, respectively, a pair of second arms 121, 122 having one ends rotatably connected to the other ends of these first arms 111, 112, respectively, and a substrate supporting portion 104 connected rotatably to the other ends of these second arms 121, 122, respectively.

Each of a pair of the first arms 111, 112 and a pair of the second arms 121, 122 has the same arm length, and a parallel linkage mechanism is formed by them. Therefore, the angle ω formed by the first arms 111, 112 and by the second arms 121, 122 varies by the rotation of the rotating shafts 101, 102 in mutually opposite directions, and the substrate supporting portion 104 is moved vertically in the figure. The substrate supporting portion 104 is rotatively moved around the base 103 by rotating the base 103 around its axis.

In this embodiment, gear members 133, 134 are also fixed around connecting shafts 131, 132, respectively, connecting other ends of the second arms 121, 122 with the substrate supporting portion 104, respectively. These gear members 133, 134 mesh with each other, and can rotate in the mutually opposite directions, thereby constituting a posture holding mechanism to constantly maintain the posture of the substrate supporting portion 104 during the rotational motion of the second arms 121, 122.

In such a frog leg type transport apparatus 130, when the substrate supporting portion 104 is to be transported from a forward position (an upper position in the figure) to a rearward position (a lower position in the figure) relative to the base 103, as shown in the figure, the substrate supporting portion needs to pass the dead center position in which a pair of the first arms 111, 112 and a pair of the second arms 121, 122 are in parallel to each other (ω=0 degree). Accordingly, in order to make a smooth passage through this dead center position, a dead center escaping mechanism 135 having a construction, as explained below, is provided in the present embodiment.

The dead center escaping mechanism 135 is configured to impart a rotative force to the second arms 121, 122 only when the substrate supporting portion passes through the dead center position in which a pair of the first arms 111, 112 and a pair of the second arms 121, 122 are in parallel to each other.

In reference to FIG. 13, a first bevel gear 136 is provided at an upper end of a rotating shaft 102 to rotate the first arm 112. This first bevel gear 136 is arranged on an upward faced side of the first arm 112; and a second bevel gear 138 engages with this first bevel gear 136. The second bevel gear 138 is axially supported rotatably on a support pole 137 assembled on a central portion of an upward faced side of the base 103. These first and second bevel gears 136, 138 constitute a driving shaft conversion portion for converting the rotary axis of the rotating shaft 102 into a direction perpendicular thereto. Further, a rotary gear 139 is integrally fixed to a shaft portion of the second bevel gear 138, and is rotated around the rotary axis converted by the above driving shaft conversion portion.

The driving shaft conversion portion and the rotary gear 139, as discussed, above make up a "rotation driving portion" in the second aspect of the present invention. Also, as an engaging portion to engage with the above-described rotation driving portion when the substrate supporting portion 104 passes the dead center position, a rack (flat gear) 141 provided on a downward faced side of the substrate supporting portion 104 is used in the present embodiment. The rack 141 is provided on a downward faced side of the support plate 140 to support the lower ends of the connecting shafts 131, 132. Its gear length can be arbitrarily set; for example, it can be set such that the rack engages with the rotary gear 139 only at the dead center position in which the second arms 121, 122 and the first arms 111, 112 are in parallel to each other (ω=0 degree) and at a predetermined angle range around the dead center position.

In the transport apparatus 130 of the present embodiment constructed as described above, the parallel linkage mechanism, which is formed by a pair of the first arms 111, 112 and a pair of the second arms 121, 122 connected to the first arms, expands and shrinks through the rotations of the rotating shafts 101, 102 in the mutually opposite directions, so that the substrate on the substrate supporting portion 104 is transported in a straight path in a front-back direction.

In the dead center escaping mechanism 135, the first bevel gear 136 rotates accompanying the rotation of the first arm 112; and the rotation axis of the rotating shaft 102 is converted to a lateral direction by 90 degrees via the second bevel gear 138 engaging with this first bevel gear 136 in FIG. 13. Then, the rotary gear 139 rotates around the converted rotary axis. In a case such that the substrate supporting portion 104 is moved in a straight path at the forward position relative to the base 103, as shown in FIG. 12, the rack 141 as the engaging portion rotates by a rotation angle corresponding to a rotation angle of the first arms 111, 112 without the second arms 121, 122 receiving any restraint force from the rotating shaft 102 because the rack does not engage with the rotary gear 139.

On the other hand, when the substrate supporting portion 104 is transported relative to the base 103 in an arrow b direction from the forward position shown in FIG. 12 toward a rearward position of the base 103, the substrate supporting portion passes the dead center position of the link in which a pair of the second arms 121, 122 and a pair of the first arms 111, 112 are in parallel to each other. In this case, the rack 141 engages with the rotary gear 139, which rotates accompanying the rotation of the first arm 112. Therefore, the second arms 121, 122 can smoothly pass the dead center position by receiving a predetermined axial torque of the rotary gear 139 in its rotation direction via the rack 141.

In addition, when the substrate supporting portion 104 is moved from the rearward position of the base 103 to the forward position thereof, a function similar to the above is performed. In this case, the rotation direction of the rotary gear 139 is reverse to the above direction.

Therefore, according to the transport apparatus 130 of this embodiment, only when the substrate supporting portion passes the dead center position in which a pair of the first arms 111, 112 and a pair of the second arms 121, 122 are in parallel to each other, the passage through the dead center can be smoothly performed due to the structural arrangement of the dead center escaping mechanism 135 providing the rotation force to the second arms 121, 112. Furthermore, the stable straight movement and improved transport accuracy of the substrate can be attained due to the prevention of the excess restraint of the second arms 121, 122 during the passage of the non-dead center position.

Further, according to the transport apparatus 130 of the present embodiment, even when the second arms 121, 122 stop once at the dead center position and are moved again from this dead center position, the second arms 121, 122 can smoothly move by benefiting from the operation of the rotation force provided by the above-described dead center escaping mechanism 135.

The respective embodiments of the second aspect of the present invention have been explained above. As a matter of course, the first and second aspects of the present invention are not limited to the above embodiments, but various changes are possible based on the technical idea of the first and second aspects of the present invention.

For example, in the above-described first embodiment of the second aspect of the present invention, in the engaging gear 120 constituting the dead center escaping mechanism 115, the engaging teeth 120a are formed only at the rotation angle engageable with the second rotary gear 118 only when the substrate supporting portion 104 passes the dead center position of the link in which the substrate supporting portion 104 is positioned immediately above the base 103. However, by the formation of another engaging teeth 120a at a position spaced apart by 180 degrees on the outer circumference of the engaging gear 120, the stable and highly-accurate driving control in the arm position at ω=180 degrees (or −180 degrees) can be ensured.

Furthermore, in the above-described respective embodiments of the second aspect of the present invention, the dead center escaping mechanisms 115, 135 are constructed by using driving force transmission mechanisms of the gear. However, instead of the above mechanism, a construction, for example, in which a rotary motor is placed on an arm connecting shaft 113 (or 114) so as to afford the axial torque only at the time of the passage through the dead center position, may be applicable.

Figure 17:
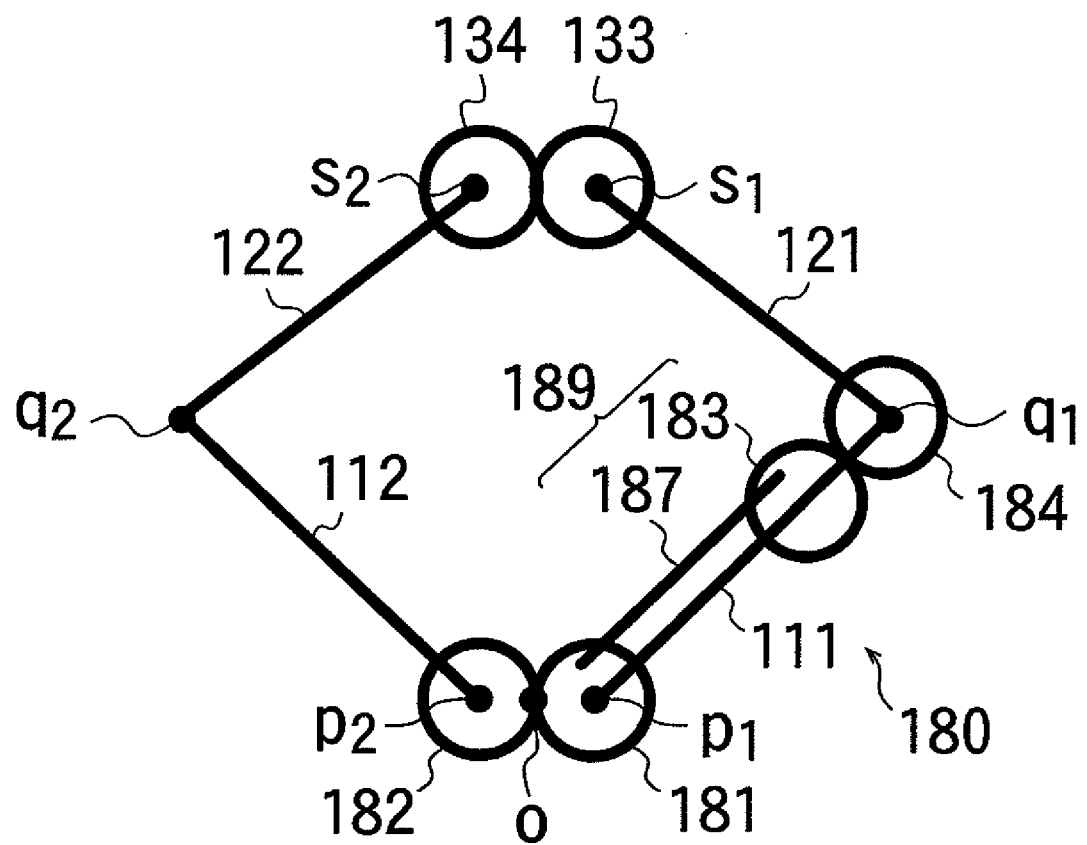
FIG. 17 is a figure for illustrating a transport apparatus with another embodiment of the dead center escaping mechanism according to the second aspect.

In addition, a dead center escaping mechanism 180 as shown in FIG. 17 will suffice. This dead center escaping mechanism 180 comprises a drive disc 182, a driven disc 181, a transmission mechanism 189, and a driven gear 184.

The drive disc 182 is disposed on one of a pair of the rotating shafts 101, 102 (here, the rotating shaft 102 on the left arm side), and the driven disc 181 is disposed on the other rotating shaft (here, the rotating shaft 101 on the right arm side). (In FIG. 17, only the rotary centers $p_1$, $p_2$ are shown with respect to the rotating shafts 101, 102.)

The drive disc 182 is fixed with respect to the rotating shaft 102 (the left arm side), on which the drive disc is arranged, and the first arm 112 fixed to that rotating shaft 102; and the driven disc 181 is relatively rotatably fitted to the rotating shaft 101 (the right arm side) on which the driven disc is arranged. The centers of the driven disc 181 and the drive disc 182 are positioned on the rotary centers $p_1$, $p_2$ of the rotating shafts 101, 102, respectively.

The driven gear 184 is fixed to the second arm 121 of a pair of the second arms 121, 122 that is connected to the first arm 111 to which the driven disc 181 is fixed, so that the driven gear rotates around the rotary center $q_1$ of the second arm 121 with respect to the first arm 111 together with the second arm 121.

Figure 18:
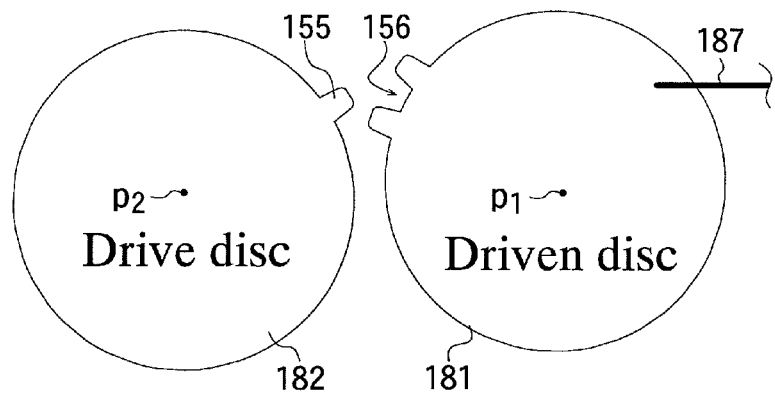
FIG. 18(a) is a figure for illustrating first and second engaging portions.
FIG. 18(b) is a figure for illustrating a state in which the engaging portions engage.
FIG. 18(c) is a figure for illustrating a driven disc in which a transmission mechanism composed of a gear can be provided.
Figure 18:
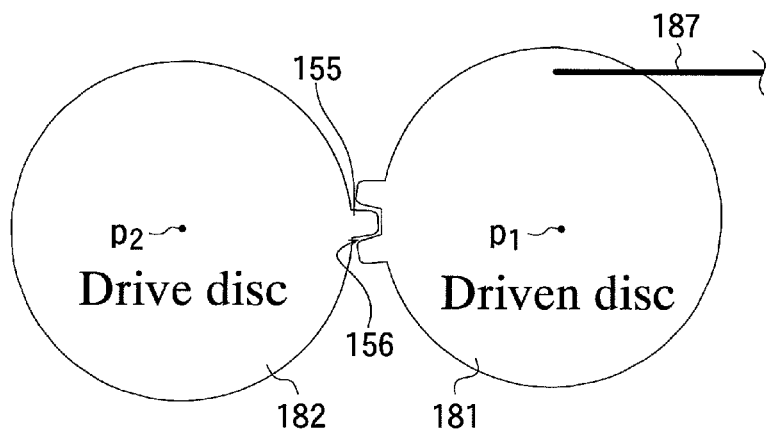
Figure 18:
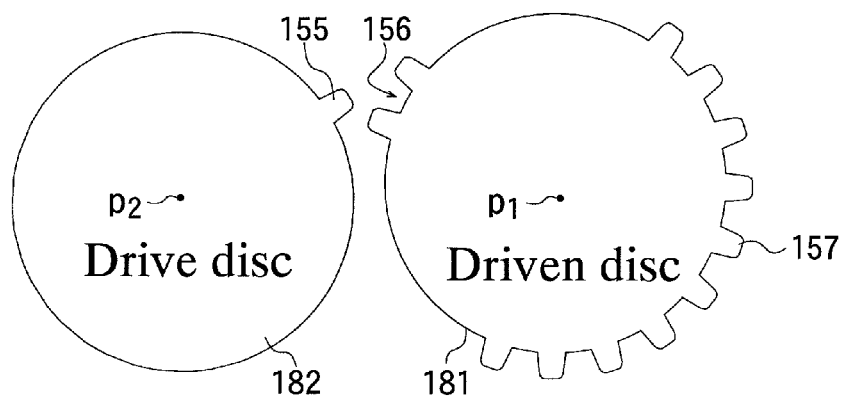

As shown in FIG. 18(a), the drive disc 182 and the driven disc 181 are provided with first and second engaging portions 155, 156 which are engageable with each other. Here, one of the first and second engaging portions 155, 156 (the first engaging portion 155, here) is a projection, and the other (the second engaging portion 156, here) has a depression engaging with that projection.

As shown in FIG. 18(b), the first and second engaging portions 155, 156 engage when the first arms 111, 112 and the second arms 121, 122 are positioned at the dead center position where the first and second arms are opened by 180 degrees, and the engagement is released when both the rotating shafts 101,102 relatively rotate, from that state, by a predetermined engaging angle $\omega_o$ or more. In other words, the first and second engaging portions 155, 156 engage in a range where the angle $\phi$ of a pair of the first arms 111, 112 is in a range of 180 degrees $-\omega_o<\phi<180$ degrees $+\omega_o$, so that the rotative force of the drive disc 182 is transmitted to the driven disc 181, thereby rotating the driven disc 181.

The engagement is released outside the range of 180 degrees $-\omega_o<\phi<180$ degrees $+\omega_o$, and the drive disc 182 and the driven disc 181 can rotate independently of each other. FIG. 18(a) illustrates a state in which the engagement is released.

The transmission mechanism 189 is provided between the driven disc 181 and the driven gear 184, and the driven disc 181 and the driven gear 184 are connected by the transmission mechanism 189. Thus, when the drive disc 182 rotates the driven disc 181 through the engagement of the first and second engaging portions 155, 156, the rotative force is transmitted to the driven gear 184 by the transmission mechanism 189, and the driven gear 184 rotates in the same direction as the drive disc 182. Therefore, when the open angle decreases to less than 180 degrees from the dead center position in which the angle between a pair of the first arms 111, 112 is 180 degrees, the second arms 121, 122 extend in a direction in which the first arms 111, 112 close, and the substrate supporting portion 104 is moved in that direction.

Since the engagement between the first and second engaging portions 155, 156 is released when the angle between a pair of the first arms 111, 112 is in a range outside 180 degrees $-\omega_o<\omega<180$ degree $+\omega_o$, the drive disc 182 and the driven gear 184 can rotate independently of each other by different angles.

In addition, when one example of the internal construction of the transmission mechanism 189 is explained, this transmission mechanism 189 comprises a transmission gear 183 and a connection rod 187.

The transmission gear 183 is attached to the first arm 111 to which the driven disc 181 is fixed. The transmission gear 183 is meshed with the driven gear 184, and rotates on the first arm 111 and around the rotary center of the first arm 111 in this state.

Near the outer circumferences of the front faces or the rear faces of the driven disc 181 and the transmission gear 183 are connected by the connection rod 187, so that the driven disc 181 and the transmission gear 183 rotate by the same angle in the same direction.

Therefore, when the driven disc 181 is rotated by applying a rotative force to the driven disc 181 from the drive disc 182, the rotative force applied to the driven disc 181 is transmitted to the driven gear 184 via the connecting rod 187 and the transmission gear 183, and the second arm 121 is rotated in the same direction as the drive disc 182, thereby getting it out of the dead center.

Moreover, as shown in FIG. 18(c), it may be that teeth 157 are provided over a semicircle at a position on a side opposite to the second engaging portion 156 in the circumferential side face of the driven disc 181, and the driven disc 181 and the driven gear 184 are connected by a plurality of transmission gears.

In this case, the rotative force, by which the drive disc 182 rotates the driven disc 181, rotates the adjacent transmission gear by the teeth 157 provided on the driven disc 181 and is transmitted to the driven gear 184 via the other transmission gear and rotates the second arm 121 in the same direction as the drive disc 182, thereby getting the second arm 121 out of the dead center.

One of the drive disc 182 and the driven disc 181 may be a gear wheel (gear), and the other may be a disc having an engaging portion engaging with the gear wheel.

Meanwhile, the first and second aspect of the present invention are the transport apparatuses also called transport robots, and, as a matter of course, can be applied not only to the substrate transport apparatus to be used in the vacuum atmosphere (such as, the vacuum transport chamber), but also to a transport apparatus to be used in the atmosphere and a transport apparatus for transporting other than the substrates.

What is claimed is:

1. A transport apparatus, comprising first and second rotary shafts rotatable around a same driving rotary axis, first and second drive links having base portions fixed to the first and second rotary shafts and being rotated by the first and second rotary shafts, respectively, first and second main rotary axes arranged at tip portions of the first and second drive links, first and second driven links having base portions fitted rotatably to the first and second drive links around the first and second main rotary axes, first and second auxiliary rotary axes arranged at tip portions of the first and second driven links, the first and second auxiliary rotary axes being spaced apart from each other, a hand portion rotatably fitted to the tip portions of the first and second driven links around the first and second auxiliary rotary axes, and a posture control unit connected between the first and second auxiliary rotary axes and the hand portion for making angles of the first and second driven links equal with respect to a line segment connecting the first and second auxiliary rotary axes and constituting an interaxial distance, wherein the hand portion moves with its identical portion being directed toward a side of the first and second shafts by the posture control unit, the distance from the first main rotary axis to the second main rotary axis through the driving rotary axis being equal to the distance from the first main rotary axis to the second main rotary axis through the first auxiliary rotary axis and the second auxiliary rotary axis in this order, and wherein the driving rotary axis, the first and second main rotary axes and the first and second auxiliary rotary axes are arranged in parallel, the transport apparatus, further comprising a dead center escaping mechanism for moving the hand portion, in a state in which the hand portion is positioned at a dead center where both an angle between the first and second drive links and an angle between the first and second driven links are 180 degrees, from a position of the dead center to a predetermined direction, wherein the dead center escaping mechanism includes a first engaging member to be rotated by the first rotary shaft, a second engaging member mounted to one of the drive links and which engages with the first engaging member when the hand portion is located at the dead center and is rotated by a rotative force of the first engaging member, and a transmission mechanism for transmitting a rotative force of the second engaging member to the second driven link connected to the same drive link as the second engaging member and rotating the second driven link in a direction identical with a rotating direction of the first drive link, wherein the first and second engaging members engage solely in a range of at least −16 degrees to at most +16 degrees from the dead center position, and transmission of the rotative force of the first engaging member to the second driven link is released by releasing engagement between the first and second engaging members.

2. The transport apparatus according to claim 1, wherein one of the first and second engaging members comprises a projection, the other comprises a depression, and the projection is fitted into the depression when the hand portion is located at the dead center.

3. The transport apparatus according to claim 1. wherein the posture control unit comprises first and second rotary members which rotate around the first and second auxiliary rotary axes, and the first and second rotary members rotate by a same angle in mutually opposite directions.

4. The transport apparatus according to claim 3, wherein the first and second rotary members are gears fixed to the first and second driven links, respectively, and the gears thereof are meshed with each other.

5. The transport apparatus according to claim 3, wherein the first and second rotary members are pulleys fixed to the first and second driven links, respectively, the first and second rotary members being spaced apart from each other and cross-wound with a belt or a chain in an "8" shaped configuration.

6. A transport apparatus, comprising;

a pair of rotating shafts which is spaced apart from each other, at least one thereof being connected to a driving source;

a pair of first arms having one ends connected to a pair of the rotary shafts;

a pair of second arms having, one ends rotatably connected to other ends of the pair of the first arms, respectively; and a substrate supporting portion rotatably connected to other ends of the pair of second arms, respectively, wherein interaxial distances of the pair of the first arms are equal to each other, wherein interaxial distances of the pair of the second arms are equal to each other, wherein the interaxial distance of each first arm is different in magnitude from that of each second arm, and wherein a distance between connecting positions at which the substrate supporting portion and a pair of the second arms are connected is set constant, the transport apparatus further comprising a posture control unit for keeping angles of the pair of second arms with respect to a line segment connecting the connecting positions equal; and a dead center escaping mechanism which affords a rotative force to the second arm when passing a dead center position where the first arms and the second arms are in parallel to each other, wherein the dead center escaping mechanism comprises a rotation driving portion communicating with one of the rotating shafts, and an engaging portion which is provided on one of the second arms and engages with the rotation driving portion solely when the substrate supporting portion passes the dead center position, wherein the rotation driving portion comprises a fixed gear disposed concentrically with one of the rotating shafts, a first rotary gear axially supported in a vicinity of one end of the one of the first arms and meshing with the fixed gear, a second rotary gear axially supported in a vicinity of the other end of the first arm, and a rotative force transmission member for transmitting a rotative force of the first rotary gear to the second rotary gear, and wherein the engaging portion is fixed to a connecting shaft between the one of the first arms and the one of the second arms and the engaging portion has engaging teeth engageable with the second rotary gear at a part of an outer circumferential portion thereof solely when the substrate supporting portion passes the dead center portion.

7. A transport apparatus, comprising;
a pair of rotating shafts which is spaced apart from each other, at least one thereof being connected to a driving source;
a pair of first arms having one ends connected to a pair of the rotary shafts;
a pair of second arms having one ends rotatably connected to other ends of the pair of the first arms, respectively; and
a substrate supporting portion rotatable connected to other ends of the pair of second arms, respectively,
wherein interaxial distances of the air of the first arms are e ual to each other,
wherein interaxial distances of the air of the second arms are equal to each other,
wherein the interaxial distance of each first arm is different in magnitude from that of each second arm, and
wherein a distance between connecting positions at which the substrate supporting portion and a pair of the second arms are connected is set constant,
the transport apparatus further comprising a posture control unit for keeping angles of the pair of second arms with respect to a line segment connecting the connecting positions equal; and
a dead center escaping mechanism which affords a rotative force to the second arm only when passing a dead center position where the first arms and the second arms are in arallel to each other,
wherein the dead center escaping mechanism comprises a rotation driving portion communicating with one of the rotating shafts, and an engaging portion which is provided on the substrate supporting portion and engages with the rotation driving portion when the substrate supporting portion passes the dead center position, wherein
the rotation driving portion comprises a driving shaft conversion portion for converting a rotary axis of the rotating shaft to a direction perpendicular thereto, and a rotary gear to rotate around the converted rotary axis, and wherein the engaging portion is a flat gear which is provided on a downward faced side of the substrate supporting portion and is engageable with the rotary gear solely when the substrate supporting portion passes the dead center portion.

8. The transport apparatus according to claim 1 wherein the first and second engaging members are gear wheels having at least two teeth each.

9. The transport apparatus according to claim 6, wherein the engaging teeth are formed so as to engage with the second rotary gear in a range of at least −16 degrees to at most +16 degrees around the dead center position.

10. The transport apparatus according to claim 1, wherein the first and second engaging members are gear wheels having at least two teeth each, and the gear wheels mesh with each other when the hand portion is located at the dead center.

* * * * *